United States Patent [19]

Pillage et al.

[11] Patent Number: 5,379,231
[45] Date of Patent: Jan. 3, 1995

[54] METHOD AND APPARATUS FOR SIMULATING A MICROELECTRIC INTERCONNECT CIRCUIT

[75] Inventors: Lawrence T. Pillage; Curtis L. Ratzlaff; Nanda Gopal, all of Austin, Tex.

[73] Assignee: University of Texas System, Austin, Tex.

[21] Appl. No.: 891,649

[22] Filed: May 29, 1992

[51] Int. Cl.⁶ ............................................. G06F 15/60
[52] U.S. Cl. ................................. 364/488; 364/489; 364/578
[58] Field of Search ............... 364/488, 489, 490, 491, 364/578

[56] References Cited

U.S. PATENT DOCUMENTS

| | | | |
|---|---|---|---|
| 4,215,420 | 7/1980 | Kassakian | 364/802 |
| 4,918,643 | 4/1990 | Wong | 364/802 |
| 5,047,971 | 9/1991 | Horwitz | 364/578 |
| 5,051,911 | 9/1991 | Kimura et al. | 364/468 |
| 5,163,015 | 11/1992 | Yokota | 364/578 |
| 5,187,692 | 2/1993 | Haneda et al. | 367/135 |
| 5,191,541 | 3/1993 | Lardman et al. | 364/489 |
| 5,313,398 | 5/1994 | Rohrer et al. | 364/468 |

OTHER PUBLICATIONS

D. F. Anastasakis et al., On the Stability of Moment-Matching Approximation in Asymptotic Waveform Evaluation, Proceedings 29th ACM/IEEE Design Automation Conference, Paper 13.2, Jun. 8–12, 1992, pp. 207–212.

John Y. Lee et al., Pole and Zero Sensitivity Calculation in Asymptotic Waveform Evaluation, IEEE Transactions on Computer-Aided Design, vol. 11, No. 5, May 1992, pp. 586–597.

Lawrence T. Pillage et al., AWEsim: Asymptotic Waveform Evaluation for Timing Analysis, 26th ACM/IEEE Design Automation Conference, Paper 38.4, 1989, pp. 634–637.

Lawrence T. Pillage et al., Asymptotic Waveform Evaluation for Circuits Containing Floating Nodes, Conference Proceedings from IEEE International Symposium on Circuits and Systems, 1990, pp. 613–616.

John W. Lee et al., Efficient Pole Zero Sensitivity Calculation in AWE, IEEE, 1990, pp. 538–541.

Xiaoli Huang, Pade Approximation of Linearized Circuit Responses, Ph.D. thesis, Carnegie Mellon University, Nov. 1990.

Pillage and Rohrer, "Asymptotic Waveform Evaluation for Timing Analysis", IEEE Transactions on Computer-Aided Design, vol. 9, No. 4, pp. 352–366, Apr., 1990.

Huang, Raghavan and Rohrer, "AEWsim: A Program for the Efficient Analysis of Linear(ized) Circuits", Internat'l. Conference on Computer-Aided Design, pp. 534–537, Nov., 1990.

Ratzlaff, Gopal and Pillage, "RICE: Rapid Interconnect Circuit Evaluator", Proceedings of 28th ACM/IEE Design Automation Conference, Jun., 1991.

Gopal, Ratzlaff and Pillage, "Constrained Approximation of Dominant Time Constant(s) in RC Circuit Delay Models", Proceedings of 13th IMACS World Congress on Computation and Applied Mathematics, Jul. 22–26, 1991.

*Primary Examiner*—Kevin J. Teska
*Assistant Examiner*—Susan Wieland
*Attorney, Agent, or Firm*—Bell, Seltzer, Park & Gibson

[57] ABSTRACT

A method and apparatus for simulating a microelectronic circuit or system includes the storing of a microelectronic circuit or system representation in a computer and then transforming the representation into an equivalent DC circuit containing resistive, capacitive and inductive elements. Then, a directed graph of the DC equivalent circuit is generated and a spanning tree is constructed therefrom. The spanning tree is then actually or virtually traversed to obtain multiple generations of circuit moments. The moments are then used to calculate the poles and residues for a given node and generate an approximate model of the circuit's transient response at that node. Moment shifting is used to provide for a stable approximate model. The actual residues corresponding to the coefficients of the time domain representation for the model can be calculated using the first $q-1$ moments. This constitutes a partial-Padé approximation.

60 Claims, 14 Drawing Sheets

METHOD AND APPARATUS FOR SIMULATING A MICROELECTRIC INTERCONNECT CIRCUIT

FIELD OF THE INVENTION

This invention relates to the design and manufacture of microelectronic circuits and systems and more particularly to simulators for evaluating the performance of a microelectronic circuit or system prior to the fabrication of the circuit or system.

BACKGROUND OF THE INVENTION

Simulation has long been an essential step in the design and manufacture of microelectronic circuits and systems. Present day Ultra-Large Scale Integration (ULSI) devices may include hundreds of thousands or millions of active electronic devices on an integrated circuit chip, which are interconnected on the chip to perform a particular function. The large capital investment required to fabricate microelectronic devices and the difficulty in reworking microelectronic devices which do not operate as planned, have produced the need to simulate circuit performance before manufacture.

Accordingly, many simulators have been developed and marketed. One widely used circuit simulator is a program which was developed at the Electronics Research Laboratory of the University of California, Berkeley, known as SPICE. A popular version of SPICE (SPICE 2) is described in "SPICE Version 2G.1 User's Guide" Berkeley: University of California, Department of Electrical Engineering and computer Science, 1980 by Vladimirescu et al. Circuit simulators have also been the subject of patent protection because they are an integral part of the design and fabrication of microelectronic devices. Recently issued patents concerning circuit simulators are U.S. Pat. No. 4,918,643 to Wong entitled *Method and Apparatus for Substantially Improving the Throughput of Circuit Simulators*; U.S. Pat. No. 5,047,971 to Horwitz entitled *Circuit Simulation*; and U.S. Pat. No. 5,051,911 to Kimura et al. entitled *Apparatus for Effecting Simulation of a Logic Circuit and Method for Producing a Semiconductor Device Using the Simulation Approach.*

Circuit simulators are typically software based, and are designed to accept a description of the circuit which defines the circuit topology and element values. Each element in the circuit is typically specified by an element line containing the element name, connected nodes, and electrical parameter values. Simulators typically simulate circuits which contain passive devices such as resistors, capacitors, inductors and mutual inductors, voltage and current sources, and active devices such as diodes, bipolar junction transistors (BJT), junction field effect transistors (JFET) and metal oxide semiconductor field effect transistors (MOSFET). The simulator can typically be configured to perform DC analysis, AC small signal analysis and transient analysis.

As the feature sizes of integrated circuits continue to shrink, and operating speeds increase, the characterization of the parasitic effects associated with the interconnect paths among the active devices becomes more critical and more difficult. In the past, the effect of interconnects could simply be disregarded when simulating the operation of an integrated circuit, because the active circuit elements dominated the simulation in terms of delay. However, as the feature sizes of integrated circuits continue to shrink, the metal resistance per unit length tends to increase and the switching speeds tend to increase. In addition, the close proximity of metal lines makes the component cross-talk capacitance larger. Even inductance effects, which are evident for boards and multichip modules which comprise microelectronic systems, may also be important for modeling the integrated circuit packaging or chip-to-package interface. Accordingly, a complete circuit simulation of an integrated circuit must now account for the resistive, inductive and capacitive effects of the interconnect paths in addition to simulating the effect of the active devices on the integrated circuit.

It will be understood by those having skill in the art that a conventional circuit simulator, such as SPICE, could be used for a complete characterization of an integrated circuit, including the active devices and the interconnect paths. However, because of the large numbers of circuit elements involved, a complete simulation becomes extremely time consuming and may exceed the storage capabilities of the processing system on which the simulation is run.

A major improvement in the simulation of interconnects is described in a publication by Lawrence T. Pillage and Ronald A. Rohrer, entitled *Asymptotic Waveform Evaluation for Timing Analysis*, IEEE Transactions on Computer-Aided Design, Vol. 9, No. 4, April 1990, pp. 352–366, the disclosure of which is hereby incorporated herein by reference. Described is an Asymptotic Waveform Evaluation (AWE) methodology to provide a generalized approach to linear resistor-inductor-capacitor (RLC) circuit response approximations. AWE is a general method for computing any number of moments for any linear circuit. Using the method, a qth order approximation to the actual circuit response can be obtained by computing 2 q moments of the circuit and matching these moments to the circuit's impulse response. The moments, in their simplest interpretation, represent the coefficients of the s-terms in the Taylor series expansion of the homogenous circuit response. Once the desired number of moments are found, they may be mapped to the dominant poles and corresponding residues. Once the poles and residues of the approximate response are found, the time domain response of the interconnect circuit may be determined.

In the AWE technique, moments of a circuit may be generated by successively solving an equivalent DC circuit with all capacitors replaced by current sources and all inductors replaced by voltage sources. The resulting voltages across the capacitors and currents through the inductors comprise one generation of circuit moments. Initially, all capacitor-current sources and inductor-voltage sources are set to zero, and independent voltage and current sources of the actual circuit are set to their final values. For subsequent moment generations, each capacitor-current source is set to the product of its capacitance and its previous moment, while each inductor-voltage source is set to the product of its inductance and its previous moment. This process may be continued until the desired number of moments are calculated.

It has been shown that, for large numbers of interconnects, AWE can provide a hundredfold speed increase compared to a conventional SPICE circuit simulation. However, notwithstanding the above described improvements, further improvements in efficiency are necessary to accommodate higher density integrated circuits. Moreover, it is known that moment matching techniques may yield unstable models having positive time constants (positive poles) for linear, passive (stable) circuits. This instability can be mainly attributed to two phenomena: (1) the extreme sensitivity of the moment values to numerical noise, and (2) the zero locations that characterize the high frequencies associated with impulse- and step-response approximations. The number of matched moments may be increased to avoid this instability. However, the result may be even more susceptible to numerical noise or may also be inherently unstable.

SUMMARY OF THE INVENTION

It is therefore an object of the present invention to provide an improved method and apparatus for simulating the behavior of a microelectronic interconnect circuit.

It is another object of the present invention to provide an improved method and apparatus for simulating behavior of a microelectronic interconnect circuit at higher speeds than conventional circuit simulators.

It is yet another object of the present invention to provide a method and apparatus for simulating the behavior of microelectronic interconnection circuits while assuring stability of the simulation.

These and other objects are provided, according to the present invention, by a method and apparatus for simulating the behavior of a microelectronic interconnect circuit in which a stored representation of the interconnect circuit is transformed into an equivalent DC circuit containing resistors, inductors and capacitors and the equivalent DC circuit is converted into a directed graph. A spanning tree of the directed graph is then traversed to obtain time moments of the interconnect circuit in an efficient manner. In order to avoid instability, a constrained optimization technique or preferably a moment shifting technique, resulting in a partial Padé approximation, are applied to map the time moments of the interconnect circuit into poles and residues for the interconnect circuit. A time domain simulation of the behavior of the interconnect circuit is produced from the poles and residues. The interconnect circuit may be modified in response to the time domain simulation, and an integrated circuit is then patterned on a semiconductor wafer according to the modified interconnect circuit, using well known techniques.

The present invention also exploits the nearly ideal structure of typical interconnect circuits which are used to model ULSI interconnects. The present invention surrenders some of AWE's generality by exploiting the tree-like structure of most interconnect circuits. Accordingly, all tree-like topologies are evaluated in a linear fashion while topologies which deviate from the tree structure are collapsed to the smallest possible matrix solution problem. By exploiting the structure of typical RLC interconnect paths, the present invention can provide better than a hundredfold speed improvement over the more generalized version of AWE, and more than a ten thousandfold speed improvement over a conventional circuit simulator such as SPICE. This significant speedup permits interconnect paths modeled with over 100,000 linear segments to be analyzed in a few seconds, in contrast to tens of hours for a general analysis.

In addition to offering improvements in speed, the present invention also typically uses much less computer storage than a generalized circuit simulation such as SPICE or even a general implementation of AWE. With circuits that contain more than 100,000 interconnects, the run time storage requirements of the circuit simulator become extremely important. The present invention exploits the typical RLC interconnect structure to reduce memory requirements by over 80% as compared to directly factoring a complete circuit matrix. This allows interconnects which could simply not be simulated before to now be simulated.

The present invention preferably applies a moment shifting technique to map the time moments of the interconnect circuit into poles and residues for the interconnect circuit. The high frequency poles are deemphasized by considering the responses due to lower frequency input signals, such as ramps, quadratics, cubics, etc. This deemphasizing effect is due to the decrease in the high frequency components of the input signal, causing the movement of the zeros towards the system poles, particularly in higher frequencies. Ramps, quadratics, cubics, etc. are powers of $s^{-1}$ in the frequency domain; therefore, these lower frequency input signals are applied by shifting the moment series before mapping to the dominant-pole approximations.

Since the system poles are invariant to changes in the input signal, the dominant-pole approximations calculated for lower frequency signals can be used to calculate the residues using the first $(q-1)$ moments of the step response. Accordingly, by applying a moment shifting technique to map the time-moments of the interconnect circuit into poles and residues for the interconnect circuit, the inherent instability associated with conventional pole approximating techniques is avoided.

The preferred moment shifting technique can be further enhanced by applying a common denominator approach to a single set of pole approximations for a selected node. Typically, this node is the input node (driving point) since the energy provided to this node by the input signal is likely to have the greatest bandwidth and highest frequency component when compared to the response signals of all other nodes. Accordingly, if the pole approximations for the driving point node are stable, there is no practical need to recalculate to see if other response nodes can be simulated by a higher order approximate model. In other words, the approximate poles calculated for the driving point are all that are needed to simulate each node in the circuit. Consequently, the user selected response nodes can be simulated by merely calculating the appropriate residues from the first $q-1$ moments.

According to another aspect of the present invention, a constrained optimization technique can be incorporated into the procedures for moment mapping. This occurs, for example, by transforming a constrained system wherein the system time constants are constrained to be negative, into an unconstrained system. According to this technique, unconstrained methods such as Newton-Raphson iteration can then be used to optimize a system of equations and achieve an optimal stable result.

According to yet another aspect of the present invention, non-ideal RLC configurations which contain resistor loops (links), for example, can be simulated using a node-tearing, or preferably a compaction technique, to solve for the resistor link currents prior to performing the path trace of the spanning tree.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

1. Introduction—Computer Aided Electronic Circuit Design and Manufacture

Figure 1:
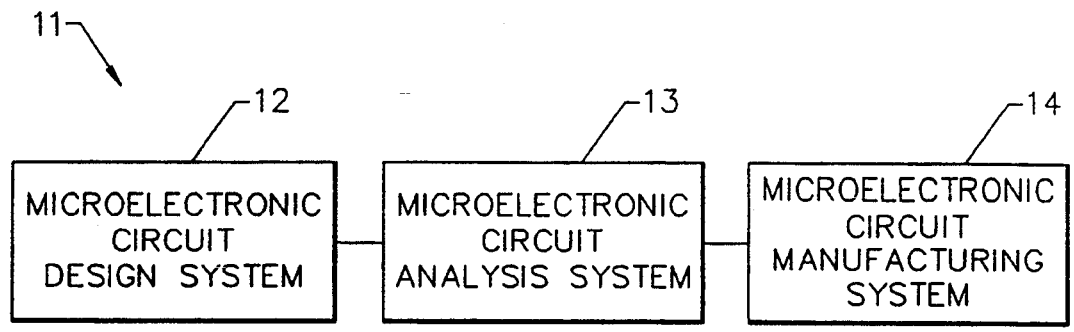
FIG. 1 illustrates a functional block diagram of a computer aided microelectronic circuit design and manufacturing system.

Referring now to FIG. 1, a functional block diagram of a computer aided microelectronic circuit design and manufacturing system 11 is shown. The system includes three general subsystems: a microelectronic circuit design system 12, a microelectronic circuit analysis system 13 and a microelectronic circuit manufacturing system 14.

The microelectronic circuit design system 12 may include circuit libraries or macros for such elements as logic gates, registers, processors and memory elements. Also typically included is a checking system which insures that the design meets the overall constraints and design rules which are compatible with the manufacturing system 14. Once it is ensured that a functional design is present, a wiring program may determine the actual wiring interconnect paths between the elements of the microelectronic circuit.

Microelectronic circuit analysis system 13 is typically employed near the end of the design process. The microelectronic circuit analysis system acts as an independent verification of the operation of the design and as a means by which relatively subtle parameter optimization can be performed. As already described, SPICE is a general purpose circuit simulation program for nonlinear DC, nonlinear transient, and linear AC analysis. Circuits may contain resistors, capacitors, inductors, mutual inductors, independent voltage or current sources, and the foremost semiconductor devices: diodes, BJTs, JFETs and MOSFETs.

After the parameters of the microelectronic circuit design are optimized using the microelectronic circuit analysis system, the parameters are provided to a microelectronic circuit manufacturing system 14 in order to produce the integrated circuit. The microelectronic circuit manufacturing system may generate the required masks, and may control the manufacturing tools for performing the various processes on semiconductor wafers, and may perform other functions to produce integrated circuit chips.

It will be understood by those having skill in the art that the microelectronic circuit design system 12, microelectronic circuit analysis system 13 and various parts of the microelectronic circuit manufacturing system 14 may be realized as software modules running on a computer system. Alternatively, standalone systems may be provided. The general design and operation of systems 12, 13, and 14 are well known to those having a skill in the art and need not be described further herein.

2. Hardware Environment of Interconnect Circuit Simulator 10

Figure 2:
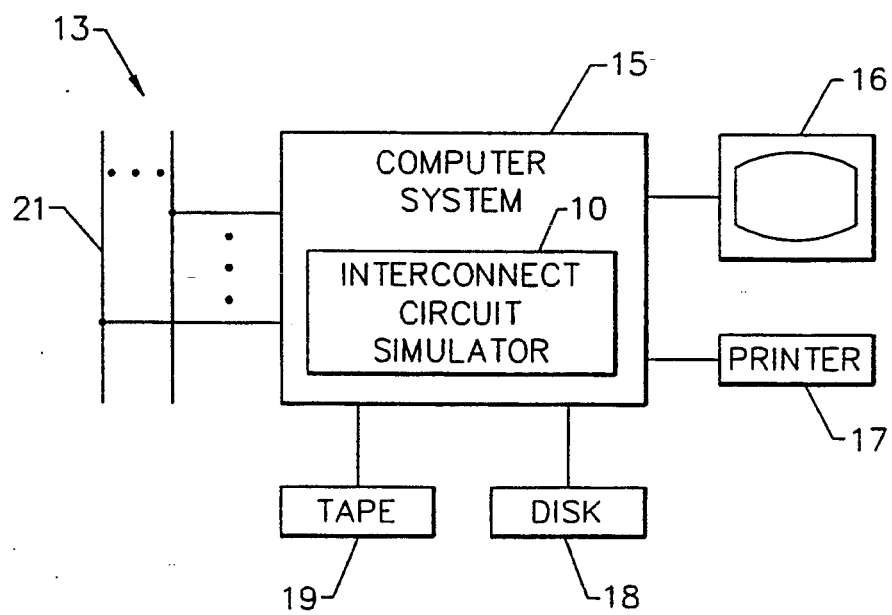
FIG. 2 illustrates a general hardware description of the microelectronic circuit analysis system illustrated in FIG. 1.

Referring now to FIG. 2, a general hardware description of the microelectronic circuit analysis system 13 (FIG. 1) will be described. As shown in FIG. 2, the microelectronic circuit analysis system 13 includes a computer system 15 which may be a mainframe, minicomputer, workstation or a personal computer. The computer system may include a number of software subsystems running thereon; one such software subsystem may be a SPICE program. Another subsystem running on data processing system 15 is the interconnect circuit simulator 10 of the present invention.

The interconnect circuit simulator 10 may accept a representation of an interconnect circuit via a tape input 19, disk input 18, or via a data bus 21 which may interface to the microelectronic circuit design system 12 (FIG. 1). A display 16 and printer 17 may be used to provide results of the interconnect circuit simulation. The results may also be communicated back to the microelectronic circuit design system 12 or microelectronic circuit manufacturing system 14 (FIG. 1) via tape 19, disk 18 or data bus 21.

The hardware design of microelectronic circuit analysis system 13 is well known to those having skill in the art and need not be described further.

As one example, the interconnect circuit simulator of the present invention may be run on a computer system which comprises a SPARC Station 1 manufactured by Sun Microsystems, Inc., having eight megabytes of physical memory.

3. Overview of Interconnect Circuit Simulator 10

Figure 3:
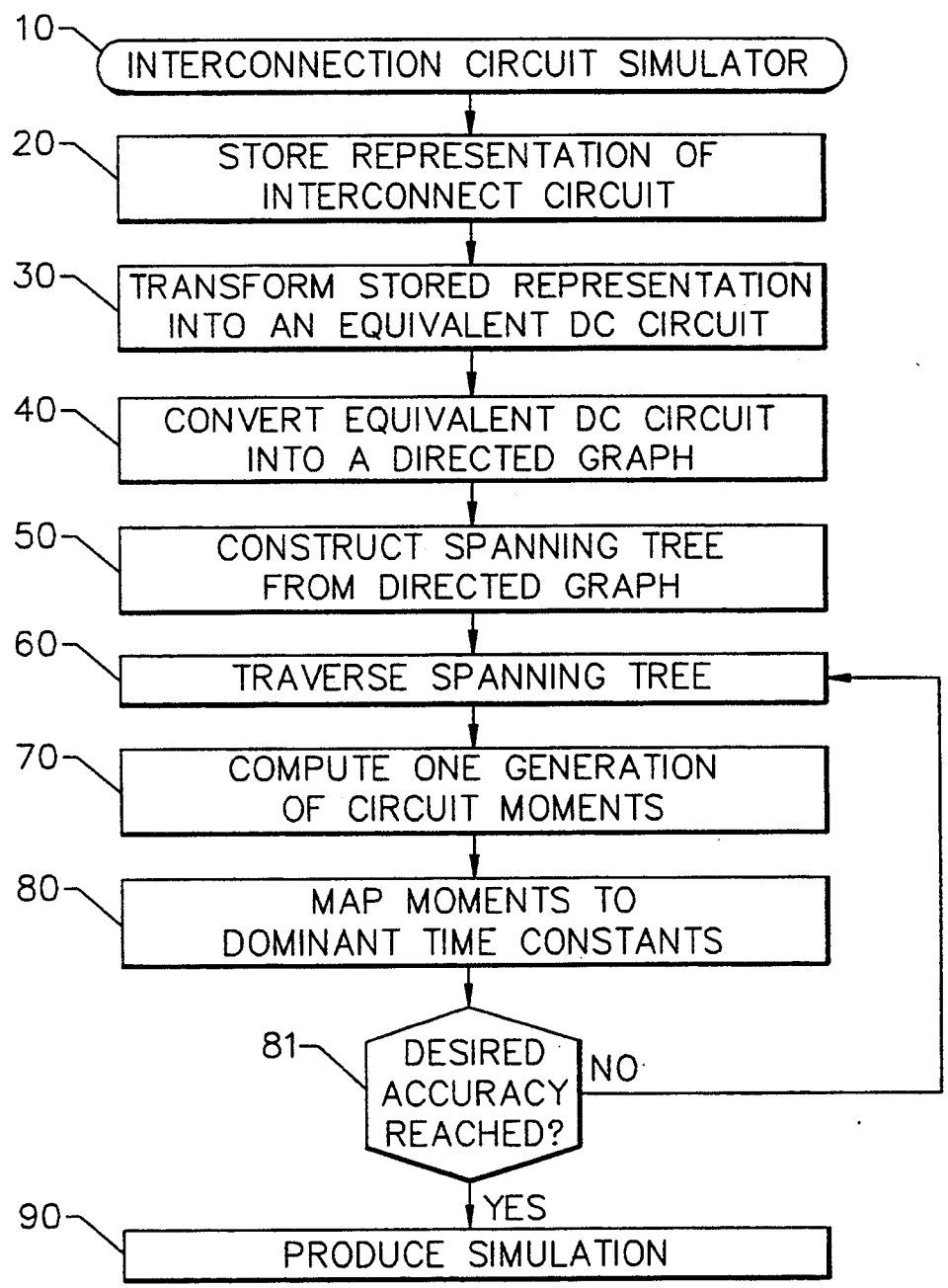
FIG. 3 illustrates the operations performed by the interconnect circuit simulator illustrated in FIG. 2.

Referring now to FIG. 3, there is illustrated an overview of the operations performed by an interconnect circuit simulator 10 according to the present invention. Each of these operations will be described in detail in subsequent sections. As shown, the first operation comprises storing a representation of the RLC interconnect circuit at block 20. It will be understood by those having skill in the art that the entire microelectronic circuit may be described in terms of a "netlist" which defines component types, component values and component interconnects for all of the components of the integrated circuit. The netlist is then parsed, using techniques well known to those skilled in the art, to separate the interconnect elements from the active elements.

As shown in Block 30, the stored representation of the RLC interconnect circuit is transformed into an equivalent DC circuit. As shown in Block 40, the equivalent DC circuit is then converted into a directed graph and a spanning tree is constructed from the directed graph at Block 50. The spanning tree is then traversed at Block 60. If there are no resistor loops present in the circuit, the next generation of moments is computed at Block 70. The moments are then mapped to the dominant time constants in Block 80 using either a constrained approximation or a preferred moment shifting technique. If the desired order of approximation is obtained, Block 81, a simulation is produced in Block 90; if not, an actual or virtual graph traversal is performed again to generate an additional set of moments. As will be understood by one skilled in the art, multiple generations of moments can be calculated all at once without regard to the number of approximate poles required, so long as there are at least twice as many moments generated for each order of approximation ultimately required. If all necessary moments are generated at once, Block 81 can be removed.

Having described the general overview of the interconnect circuit simulator 10 of the present invention, a detailed description will now follow. The detailed description will be preceded by a description of the Asymptotic Waveform Evaluation (AWE) technique. This technique introduced the concept of moment matching to the simulation of interconnect circuits. Following the discussion of AWE, each of the operations of FIG. 3 will be described in detail in subsequent sections.

4. Asymptotic Waveform Evaluation (AWE)

Asymptotic Waveform Evaluation (AWE) represents a technique for approximating the transient response of general linearized interconnect circuits, for example, and involves the matching of 2 q moments of the exact circuit response to a q-pole model, characterized by the q most dominant time constants. The model represents an analytical transfer function for the circuit which is useful when repetitive forcing functions must be analyzed. This allows the interconnect characterization to be pre-processed for higher levels of simulation.

The AWE methodology represents a qth order extension of the first-order Elmore delay approximation and can be used to predict a transient waveform at any circuit node. A description of AWE is provided in an article written by Rohrer and Pillage, entitled *Asymptotic Waveform Evaluation for Timing Analysis*, cited above, and in an article written by Huang, Raghavan and Rohrer, entitled *AWEsim: A Program for the Efficient Analysis of Linear(ized) Circuits*, published at the International Conference on Computer-Aided Design in November, 1990, pp. 534–537, the disclosures of both of which are hereby incorporated herein by reference. As described in these articles, the matching process requires twice as many moments as poles, since q poles and q residues are matched, resulting in 2 q unknowns. Moment matching is a Padé approximation which has been applied to various model-order reduction problems as described in a publication entitled *Stable Reduced-Order Models Using Padé -Type Approximations*, by Y. Shamash, published in IEEE Transactions on Automatic Control, AC-19, pp. 615–16 (1974).

In AWE, the moment matching step is preceded by the calculation of a first set of moments; this occurs by LU-factorization of the equivalent DC circuit matrix. Successive moment calculations involve forward and backward substitutions. AWE formulates the matrix equations using tree link analysis.

As will be understood by one skilled in the art, the moments represent the coefficients of the s-terms in the Taylor series expansion of the homogeneous response of a stable system. For instance, consider the impulse response at a node, dv/dt (the unit step response is v(t)). Then $$\mathcal{L}(\dot{v}(t)) = H(s) = \int_0^\infty \dot{v}(t) e^{-st} dt \tag{1}$$

Expanding $e^{-st}$ into its Taylor series about s=0, $$H(s) = \left[ \int_0^\infty \dot{v}(t)dt - s\int_0^\infty t\dot{v}(t)dt + \frac{s^2}{2!}\int_0^\infty t^2\dot{v}(t)dt - \ldots \right] \tag{2}$$

Where the moments are the coefficients of the s terms, i.e., $$m_i = \frac{(-1)^i}{i!} \int_0^\infty t^i \dot{v}(t)dt \tag{3}$$

From 2 q moments, a unique qth order response is specified. This qth order response, when transformed to its time domain step response equivalent, has the form:

$$v(t) = v_p + k_1 e^{p_1 t} + k_2 e^{p_2 t} + \ldots k_q e^{p_q t} \tag{4}$$

where $v_p$ is the particular (steady state) solution, $p_i$ is the value of the ith pole, and $k_i$ is the value of the corresponding ith residue.

AWE only requires a single DC circuit analysis to generate a complete set of circuit moments wherein the number of pairs of moments calculated determines the degree of accuracy between the qth order modelled response and the actual response. The AWE analysis can be performed using one of many techniques, such as Modified Nodal Analysis (MNA), Tree-Link Analysis, Sparse Tableau, etc. When a very general technique, such as MNA, is used to solve the circuit, there is virtually no limitation on circuit complexity so long as the circuit is linear(ized). Although it has been shown that an AWE analysis can result in a hundredfold speedup over SPICE, even greater savings can be obtained using the methodologies of the present invention by exploiting the near tree topology of most RLC interconnect circuits.

5. Store Representation of Interconnect Circuit, 20

Figure 18A:
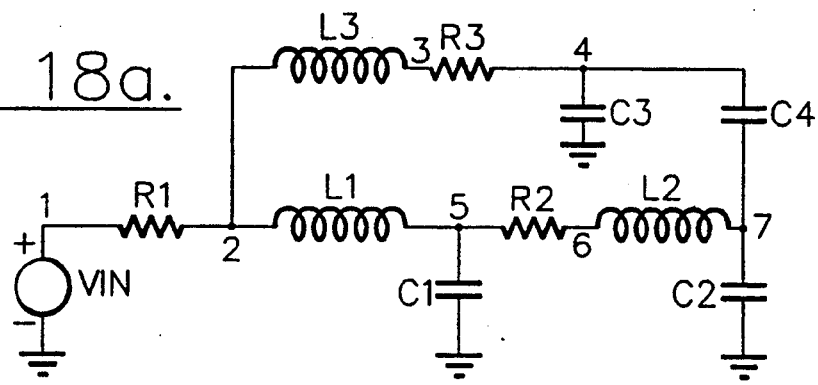
FIGS. 18a, 18b and 18c illustrate an electrical schematic for an interconnect circuit, the DC equivalent to the circuit, and the corresponding directed graph and spanning tree, respectively.

Referring again to FIG. 3, the operations for producing a set of moments for a linear passive RLC circuit begins with the input and storage of the interconnect circuit representation as shown by Block 20. For purposes of example and to provide a better understanding of the invention, FIG. 18(a) shows a representative RLC interconnect circuit capable of being stored and simulated. It will be understood that this circuit is non-limiting, and that more complicated interconnect circuits are typically simulated. Techniques for storing an interconnect circuit representation are well known to those skilled in the art and need not be described further herein.

6. Transform Stored Representation into an Equivalent DC Circuit, 30

Figure 18B:
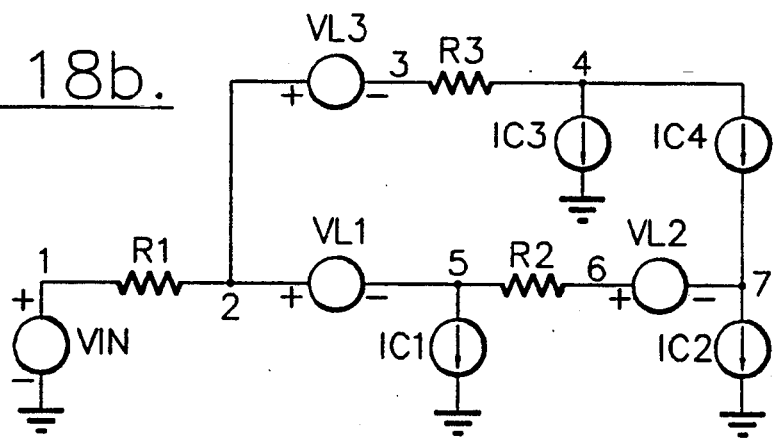

The stored circuit representation is then transformed to its equivalent DC circuit, Block 30, by replacing all capacitors with current sources and all inductors with voltage sources. The transformed circuit is shown in FIG. 18(b). A linear passive RLC circuit, when transformed, contains only independent voltage sources, independent current sources, and resistors, regardless of the topology. The values of these sources are assigned as the product of the component's capacitance or inductance value and its previous moment as explained more fully hereinbelow.

7. Construct Directed Graph and Spanning Tree, 40, 50

Figure 18C:
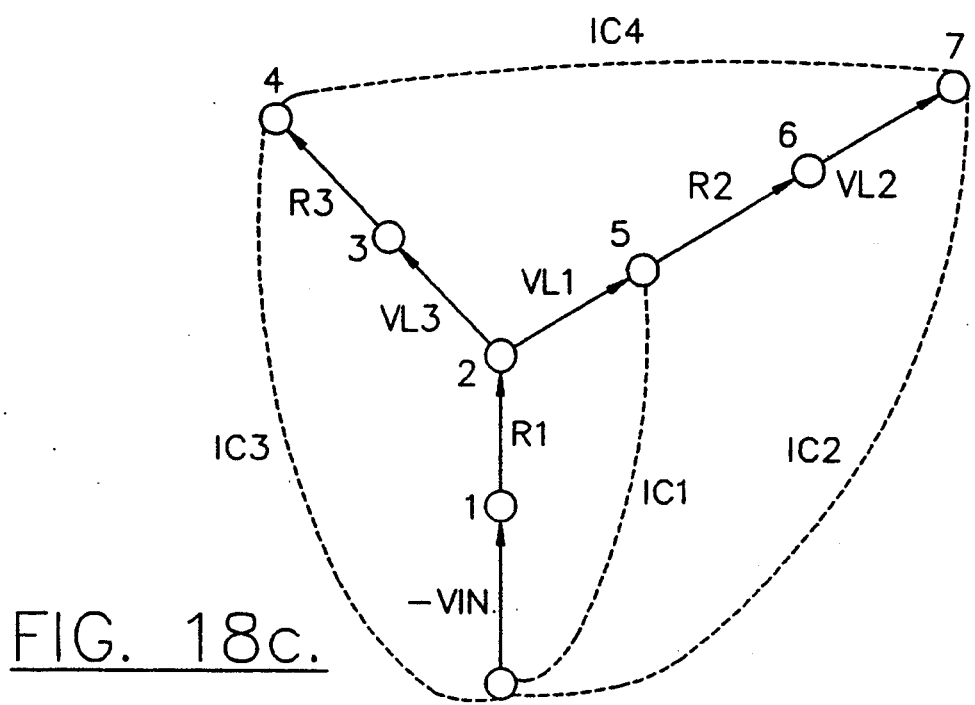

Using techniques described in an article written by Pillage, Ratzlaff and Gopal, entitled *RICE: Rapid Interconnect Circuit Evaluator*, presented at the 28th ACM/IEEE Design Automation Conference, San Francisco, Calif., June 1991, a directed graph and spanning tree, Blocks 40 and 50, respectively, can be generated from the equivalent DC circuit; this article was published at the ACM Workshop on Timing Issues in Specification and Synthesis of Digital Systems, August 1990, and its disclosure is hereby incorporated herein by reference. The directed graph and spanning tree are shown by FIG. 18(c). As will be understood by one skilled in the art, a directed graph contains all the nodes and arcs or branches connecting each node as defined by the DC equivalent circuit, whereas a spanning tree is a connected graph wherein each node is connected to each other node by exactly one unique path and no loops of branches are present.

As will be understood by one skilled in the art, in order to obtain efficient path-tracing, a directed graph as opposed to an undirected graph must be created from the equivalent DC circuit. This is accomplished by a single depth-first traversal from the root (ground) node to all leaf nodes during which the inward branch of each circuit (graph) node is identified. By definition, each node (except ground) has exactly one inward (tree) branch which connects the node to its predecessor node. All other tree branches will be referred to as outward branches. The directions inward and outward are relative to the ground node. The successive traversal of inward branches always terminates at the ground node, while the successive traversal of outward branches terminates at each leaf node.

Figure 4:
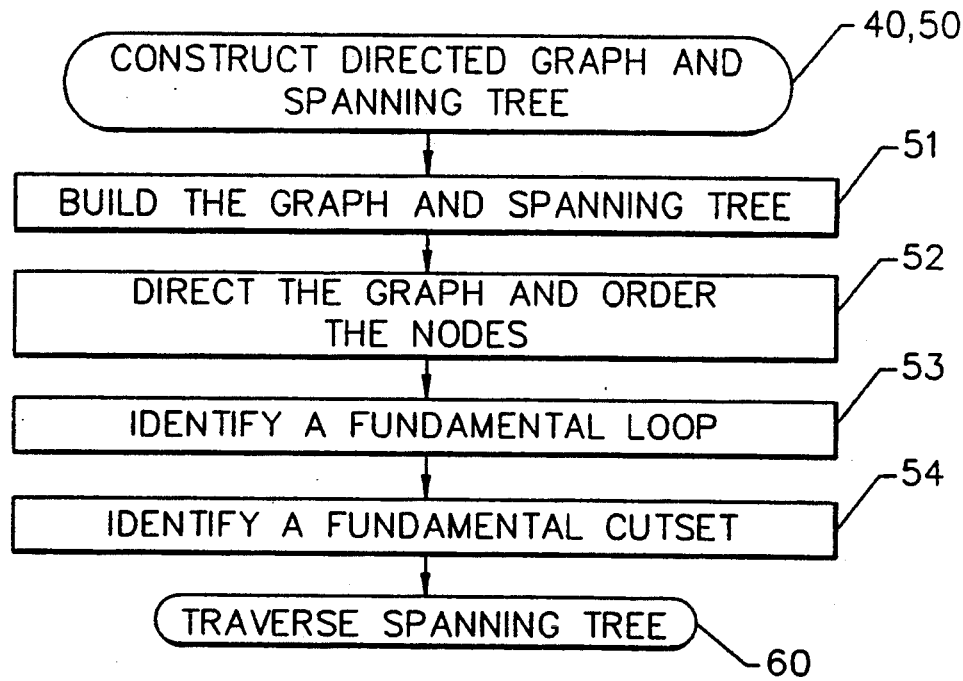
FIG. 4 illustrates the operations performed in constructing a directed graph and spanning tree.

The following sections describe techniques for efficiently constructing the directed graph and spanning tree. Moreover, these sections are supplemented by pseudo-code instructions describing each step of the technique, and by FIG. 4 wherein the operations for constructing the directed graph and spanning tree are further defined by Blocks 51–54. As shown, the graph and spanning tree are built in Block 51 and the graph is then directed and the nodes are ordered in Block 52. Next, the fundamental loop and cutset are defined, Blocks 53 and 54, respectively.

7A, Building the Graph and Spanning Tree, 51

Prior to building the graph and spanning tree, the branches (edges) must be ordered as follows: voltage sources, inductors, resistors, capacitors, and current sources. This order, which may be established as devices are read from the circuit file, guarantees that voltage sources, inductors, and resistors receive priority as tree branches and capacitors and current sources receive priority as links. As a device is selected from the ordered list and added to the graph, it is immediately classified as a tree branch or link and added to the appropriate list. The tree branches and links are maintained in separate subgraphs to reduce the overhead required to traverse the spanning tree.

Before the graph construction begins, a list of integer subtree identifiers (ID's) is initialized to zero. There is a subtree ID for each graph node. Zero indicates the corresponding node has not been assigned to a subtree. Referring now to the pseudo-code instructions provided in TABLE 1, after a branch has been added to the graph, it is classified as a link or tree branch by checking the subtree ID's of the branch's nodes. If the ID's of both nodes are the same and non-zero, then the branch forms a loop and is classified as a link, otherwise it is classified as a tree branch in a given subtree. If the subtree ID's for the two nodes are different, then the addition of the new branch connects two disjoint subtrees. In this case, the smaller subtree is traversed to change the ID's of each of its nodes to match that of the larger subtree. In general, this subtree (ID) updating procedure has a complexity of n log n. However, that is the worst case complexity for random netlist orderings. Most netlists encountered are not in random order but are often organized in sub-blocks of small trees. The complexity is nearly linear for these net lists. Moreover, this procedure is invoked only one time rather than for each moment generation.

After all branches have been added to the graph, the subtree rooted at node zero (ground) should contain all nodes of the circuit; if not, an unconnected node exists in the circuit. This constitutes an error and would be flagged during the graph building step.

TABLE 1

```
procedure BuildGraph
    for (each branch of circuit)
        if (IsInSpanningTree)
            Insert in tree subgraph;
        else
            Insert in link subgraph;
```

TABLE 1-continued

```
        endif
    end BuildGraph
    boolean function IsInSpanningTree
        (branch is between unassigned nodes):
            Assign nodes to new subtree;
            Subtree size = 2;
            return true;
        (branch has one unassigned node):
            Get subtree id of assigned node;
            Assign unassigned node to subtree;
            Add one to size of subtree;
            return true;
        (branch is between assigned nodes):
            if (both nodes in same subtree)
                return false
            else
                for (each node of smaller
                    subtree) Change node to id of
                    larger;
                endfor
                Increase size of larger subtree
                    by size of smaller;
            endelse
            return true;
        endcase
    end IsInSpanningTree
```

7B. Directing the Graph and Ordering the Nodes, 52

Referring now to TABLE 2, after the graph is constructed and the tree identified, the tree is traversed from the ground node to the leaf nodes to identify the inbound and outbound directions for each tree branch. This directional information is required later to identify fundamental loops and cutsets, thus avoiding explicit construction of the F-matrix as noted below in Section 8. Directing the graph is typically only necessary if link resistors, link inductors, or tree capacitors are present.

The graph is directed by performing a depth-first traversal of the tree starting at the ground node. As each node is visited, its number is appended to a list of nodes, hereinafter referred to as the nodelist. The nodelist is used in later steps to traverse the tree without performing the depth-first traversal. Furthermore, the tree branch which connects this node to the rooted subtree is designated as the node's inward branch. Identifying the inward branch for each node allows a traversal to begin at any node in the graph and continue to the ground node or to a leaf node without guessing.

TABLE 2

```
procedure DirectGraph
    allocate temp stack;
    allocate node_list;
    push ground node onto stack;
    while (stack not empty)
        pop node;
        append node to node_list;
        for (each incident tree branch)
            if (opposite node visited)
                make branch the "inward branch";
            else
                push opposite node;
            endif
        endfor
    endwhile
    discard stack;
end DirectGraph
```

7C. Identifying a Fundamental Loop, 53

The purpose of directing the graph is to enhance the ability to quickly identify the member tree branches comprising a loop between the nodes of a link branch. This ability is required to implement the procedures described below in section 8.A.6. for handling troublesome branches (e.g., resistor links, tree capacitors, and link inductors).

Referring now to TABLE 3, identification of the fundamental loop associated with any specified link in the graph begins by initiating a backward and forward traversal of the spanning tree starting at each of the link nodes. The traversal direction is always towards the ground via the inward branch and the traversal alternates between the two prongs. Each inward branch is flagged as "visited" as it is traversed to the other node of the branch. Additionally, the branch is added to a preliminary list of branches that comprise the loop. This continues until the two "prongs" intersect, indicated by encountering an inward branch that has already been visited. Finally, the final list of loop members is obtained by traversing from the twice-visited branch to the first unvisited branch. These branches along this path must be removed from the preliminary list of loop members to yield the final list.

A compressed list is used to improve the efficiency of the overall procedure and subsequent procedures. The compressed list technique stores a string of consecutive branches as a single entry in the list.

TABLE 3

```
procedure FindFundamentalLoop
    node1 = a node of the link;
    node2 = other node of the link;
    list = nil
    mark all branches as unvisited;
    repeat
        get inward branch of node1;
        if (branch not visited)
            mark branch and add to list;
            if (node2 not ground node)
                swap node1,node2;
            endif
        else
            repeat
                node1 = other node of branch;
                get inward branch of node1;
                if (branch is visited)
                    remove branch from list;
                endif
            until (branch not visited)
        endelse
    until (node1 equals node2)
end FindFundamentalLoop
```

7D. Identifying a Fundamental Cutset, 54

Referring now to TABLE 4, identification of the cutset for a specific tree (inward) branch is achieved by performing a depth-first traversal of the spanning tree beginning at the node associated with the inward tree branch. As the traversal proceeds, all links which are encountered once are added to the cutset while those encountered twice are removed from the cutset. The same compressed list technique described previously is used to maintain the cutset list.

TABLE 4

```
procedure FindFundamentalCutset
    allocate stack;
    cutset = nil;
    set node associated w/branch;
    push node onto stack;
    while (stack not empty)
        pop node from stack;
        for (each link at node)
            if (link is in cutset);
                delete link from cutset;
```

TABLE 4-continued

```
        else
            insert link into cutset;
        endif
    endfor
    for (each outward tree branch)
        push other node onto stack;
    endfor
endwhile
end FindFundamentalCutset
```

8. Traverse Spanning Tree and Generate Moments, 60, 70

After the circuit graph and spanning tree are constructed, a path tracing procedure or traversal is used to generate a set of circuit moments; two moments are required for each model order. Generally, for RC circuits a second- or third-order model will be required. This requires four to six moment generations. For even a moderate sized interconnect circuit, the computation of four to six moments dominates the overall computation time for the entire process. Thus, it is desirable to make the path tracing process efficient.

In one embodiment of the present invention, an efficient repeated traversal technique having linear complexity and requiring only partial F-matrix construction for handling resistor loops, for example, is used to compute each generation of moments as shown by Block 70, in FIG. 3. In another embodiment, the repeated traversal of the graph and tree is eliminated in favor of a preferred single traversal technique that among other things, memorizes the location and order of data and performs a virtual path trace. Both of these embodiments will be explained in greater detail below under their corresponding headings.

It will also be understood by those having skill in the art that the above described steps of converting the equivalent DC circuit into a directed graph having a spanning tree and traversing the spanning tree may be accomplished without directly generating the directed graph and spanning tree. Rather, for a circuit which exhibits tree or near-tree topology, a nodal analysis matrix may be created directly from the circuit description (netlist) and the equations of this matrix can be ordered such that a tree or near-tree topology creates minimal fill-ins (i.e. zero terms which become nonzero) during factorization of the matrix. Accordingly, by properly ordering the nodal analysis matrix, the equivalent DC circuit can be converted into the equivalent of a directed graph having a spanning tree, without actually forming the directed graph. The properly ordered matrix can then be factored to obtain the equivalent of traversing the spanning tree. Thus, the directed graph generating step and the spanning tree traversing step are indirectly performed.

In particular, for a tree or near tree topology, a nodal analysis matrix may be created directly from the circuit description. The equations of this matrix are then ordered so that a tree topology creates no fill-ins during factorization and a near-tree topology creates a relatively small number of fill-ins. Two examples of ordering the equations of the matrix will now be described. In a first example, known as "minimum degree" ordering, nodal analysis equations are expressed so that there is one equation for each node of the circuit. Minimum degree ordering then starts by selecting the equation corresponding to the node in the circuit with the least number of elements connected to it, i.e. the least number of terms in its matrix row. This node constitutes a minimum degree node. All of the branches connected to this minimum degree node are removed from consideration, thereby decreasing the degree of some of the other nodes. Then, the next node of minimum degree is chosen, and the ordering process described above is again performed. This process continues until all of the nodes have been ordered. By practicing the minimum degree ordering process described above, the number of fill-ins during factorization is minimized and the matrix becomes zero fill-in for the case of a tree topology.

A second ordering scheme, known as "Reverse Cuthill McKee" (RCM) also results in a matrix which can be factorized without fill-in for the case of a "tree" topology. RCM ordering is also desirable because it tends to minimize the bandwidth of the matrix, i.e. minimize the distance of any matrix entry from the diagonal, thus resulting in a nearly banded matrix. This ordering scheme will be described below, in section 8.B.3.2 in connection with solving resistor loops. By banding the matrix, the nodal equations may be solved by a vectorized Cholesky Decomposition.

After the matrix has been ordered, using any of the techniques described above or any other known technique, the matrix can be factorized to obtain the moments of the microelectronic circuit. The moments can be evaluated as already described. The above described matrix based ordering techniques are further described in a textbook entitled *Direct Methods for Sparse Matrices*, by Duff et al., Oxford Science Publications, 1986 (ISBN No. 0198534086) the disclosure of which is hereby incorporated herein by reference.

Figure 5:
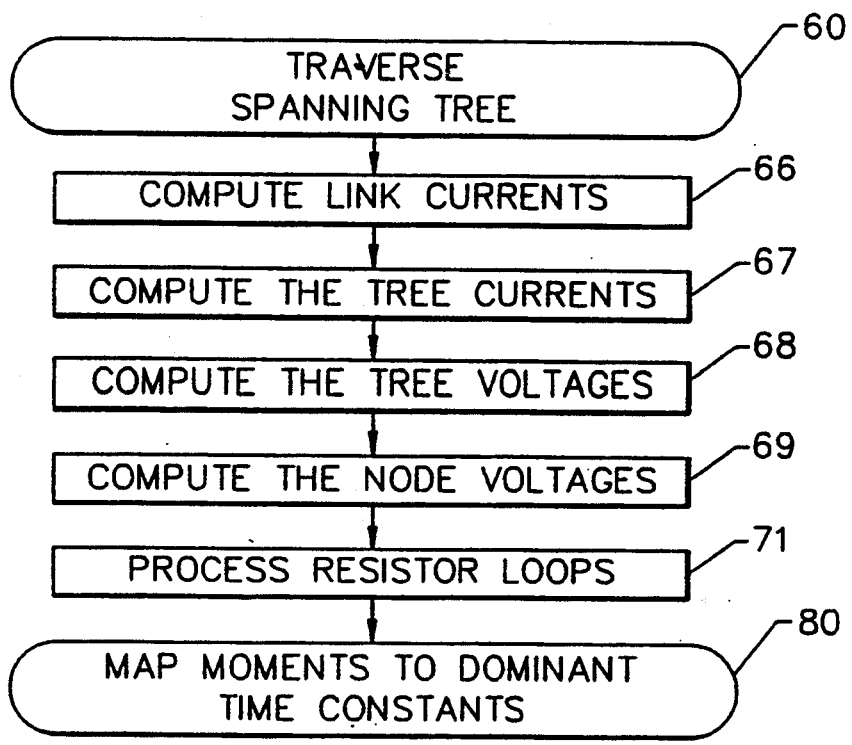
FIG. 5 illustrates operations for performing a repeated traversal of the spanning tree and generating circuit moments.

Referring now to FIG. 5, the repeated traversal technique described in the following section begins with the preliminary computation of all link currents as shown by Block 66. Next, all tree branch currents and corresponding tree branch voltages are computed, Blocks 67 and 68. This is followed by the computation of all node voltages, Block 69, and the subsequent computation of all resistor link currents using a node tearing or similar technique, if necessary, Block 71.

8.A.1. Repeated Traversal Technique for Generating Moments

Once the circuit graph and spanning tree have been constructed as previously described, they are used to solve the DC circuit by generating a series of sets of circuit moments. As shown in the example interconnect circuit shown in FIG. 18 and accompanying discussion, there are two basic steps to computing a new set of moments—solving for tree currents and solving for node voltages.

Referring now to TABLE 5, the operation begins by computing all link current sources of the equivalent DC circuit. Next, if there are any link inductors in the circuit, a combination of these link currents is used to solve for the currents of all link inductors using, for example, flux conservation techniques as described in an article entitled *Asymptotic Waveform Evaluation for Circuits Containing Floating Nodes*, by Rohrer, Pillage, and Huang, published in IEEE International Symposium on Circuits and Systems, May 1990, the disclosure of which is hereby incorporated herein by reference. Once all link currents are known, the tree branch currents are easily obtained by traversing the graph. The resulting tree branch currents yield the next set of moments for inductors. Following this is a calculation of all tree branch voltages. If any tree capacitors exist in the circuit, then some combination of tree branch voltages specifies the tree capacitor voltages. The technique for solving for tree capacitor voltages is similar to the technique for determining link inductor currents and is also described in the article cited immediately above; the technique uses charge conservation to resolve the tree capacitor voltages. Finally, the tree branch voltages are used to compute the node voltages by performing another traversal of the tree. If there are any resistor links present in the circuit, then the node voltages are only preliminary and are used to solve for the resistor link currents. These currents are then used to update the preliminary node voltages to their final values. This updating process is described in detail in Section 8.A.6.

After the first generation of moments have been computed, the initial conditions (if any) are applied by subtracting them from the respective steady state solution. This allows either equilibrium or non-equilibrium initial conditions on capacitors or inductors to be handled.

After the second generation of moments has been generated, a frequency scale factor is computed as the quotient of the first and second generation voltages at a response node designated by the user. Next, all second generation moments are scaled (multiplied) by this factor and all subsequent moment generations (3rd, 4th, etc.) are scaled by an integral power of this factor. Scaling is necessary to improve the numerical conditioning of the resulting moment matrix used to perform the matching to the dominant time constants, and is further described in the article entitled *Asymptotic Waveform Evaluation for Timing Analysis*, cited above.

TABLE 5

```
procedure ComputeNextGeneration
    ComputeLinkCurrents
    if (any link inductors)
        SolveLinkInductors;
    endif
    ComputeTreeCurrents;
    ComputeTreeVoltages
    if (any tree capacitors)
        SolveTreeCapacitors,
    endif
    ComputeNodeVoltages;
    if (any link resistors)
        SolveLinkResistors;
        UpdateForResistorLinks;
    endif
    if (1st generation)
        apply initial conditions;
    endif
    if (2nd generation)
        compute frequency scale factor;
    endif
end ComputeNextGeneration
```

8.A.2. Computing Link Currents, 66

Referring now to TABLE 6, the link currents, excluding resistor and inductor links, are computed as the product of the previous capacitor moment (voltage) and the corresponding capacitor value. This product is then multiplied by the frequency scale factor mentioned above. If there are no previous moment generations, all capacitor-current sources are set to zero and all independent current sources of the original circuit are set to their final values. If there are one or more previous generations, all independent current sources of the original circuit are set to zero.

TABLE 6

```
procedure ComputeLinkCurrents
    if (no previous moments)
        Set all capacitor currents to zero;
        Set all independent I-sources to
            final values;
    else
        for (each link capacitor)
            Set cap current to C* prev moment;
            Scale cap current by freq scale;
        endfor
        Set all independent I-sources to 0;
    endelse
end ComputeLinkCurrents
```

8.A.3. Computing the Tree Currrents, 67

Referring now to TABLE 7, the tree currents are computed by visiting each node of the tree in reverse order specified by the nodelist and summing all link and tree branch currents at the node excluding the current of the inward branch. This sum is stored as the total current of the inward branch. Since the nodelist was derived from a forward depth-first traversal of the spanning tree, visiting each node of this list in reverse order is equivalent to a reverse depth-first traversal of the tree. This guarantees that all necessary branch currents are known when each node is visited.

TABLE 7

```
procedure ComputeTreeCurrents
    for (each node in reverse node list)
        current = 0;
        for (each incident branch)
            if (not inward tree branch)
                Add branch's current to current;
            endif
        endfor
        Store current for inward tree branch;
    endfor
end ComputeTreeCurrents
```

8.A.4. Computing the Tree Voltages

Referring now to TABLE 8, the tree voltages, excluding tree capacitor voltages, are easily solved after the tree currents are known. Resistor tree branch voltages are computed by applying Ohm's Law. The branch voltages for independent voltage sources of the original circuit are set to their final values if there are no previous moment generations, otherwise they are set to zero.

The voltage for each tree branch inductor-voltage source is set to the product of the inductor's value and its previous moment (current). Additionally, this value must be scaled by the frequency scale factor as described above. Before the inductor tree branch current is overwritten, it must be swapped with the previous inductor moment, since it is required for the next moment generation.

TABLE 8

```
procedure ComputeTreeVoltages
    for (each tree resistor)
        branch_V = branch_I* R;
    endfor
    for (each tree inductor)
        branch_V = previous moment* L;
        Scale branch_V by freq scale factor;
        previous_moment = branch_I;
    endfor
    if (no previous moments)
        Set branch voltage of every
            independent vsource to final value;
    else
```

TABLE 8-continued

```
    Set branch voltage of every
        independent vsource to 0;
    endelse
end Compute Tree Voltages
```

8.A.5. Computing the Node Voltages, 68

Referring now to TABLE 9, once the tree voltages are available, the node voltages are computed by visiting each node in the order dictated by the forward nodelist. As each node is visited, its voltage is computed as the difference of its predecessor node voltage and its inward branch voltage. The voltage at node zero (ground) should be initialized to zero before starting the traversal. Use of the forward nodelist is analogous to performing a forward depth-first traversal of the spanning tree, which guarantees a node is not visited until the voltage of its predecessor is known.

The last step required, once the node voltages are known, is to update the new capacitor moments using the node voltages. This is analogous to the voltage differential between the terminals of each capacitor.

TABLE 9

```
procedure ComputeNode Voltages
    Set voltage of gnd node to zero;
    for (each node in forward node_list)
        Get other node of the inward branch;
        Set node voltage to voltage of other
            node minus inward branch voltage;
    endfor
    for (each capacitor in circuit)
        New moment is the difference of the
            cap's node voltages;
    endfor
end ComputeNodeVoltages
```

8.A.6. Handling Resistor Loops, 71

Figure 19:
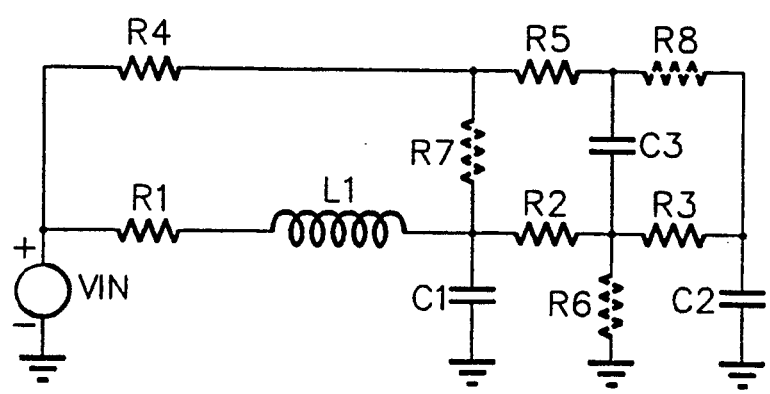
FIG. 19 illustrates an electrical schematic for a circuit containing three (3) resistor loops.

Resistor loops (links) in the circuit description are preferably handled using special procedures since the resistor link currents are not known a priori and cannot be trivially computed. Resistor links are caused by the addition of resistors to a tree-like circuit without adding additional nodes. For example, FIG. 19 shows an interconnect circuit having three resistor links, $R_6$, $R_7$ and $R_8$.

A resistor loop is recognized when a resistor is forced to be in the set of links during creation of the spanning tree. To solve for the resistor link current, a "node tearing" technique described by G. Kron in a book entitled *Tensor Analysis of Networks*, Wiley, New York, 1939, is used to permit a path trace. This technique involves the "tearing away" of each link resistor branch, analyzing the circuit with the link resistors removed, recording the open circuit voltages at the tears, and then using these voltages to solve for the current that would flow through each resistor link, had the tears not been performed. Next, the obtained currents are substituted back into the original circuit as current sources in place of the links and the circuit is resolved with the new current values.

Solving for the resistor link currents involves solving m linear equations, where m is the total number of resistor links in the circuit. These linear equations are characterized by a connection matrix which accounts for the coupling of a particular resistor link with all other resistor links in the circuit. When the inverse of the connection matrix is applied to the vector of open circuit voltages at the tears, the resistor link currents will result. I.e., $$Ri = v_{oc} \quad (5)$$

where R is an m×m connection matrix, i is an m-vector of resistor link currents, and $v_{oc}$ is the m-vector of open circuit voltages at the respective tears.

The formulation of the connection matrix is preferably accomplished during the setup phase after the graph and spanning tree have been formed but prior to computing any moments. Formulating the matrix is the most complex part of the node tearing process; each row of the matrix is formulated by applying a 1-amp current source between the terminals of a given tear with all other independent sources in the circuit turned off. The resulting voltage across the applied current source is the diagonal term of this row. The resulting voltages across all other tears comprise the remaining terms in the row. This process is repeated for each resistor link.

This procedure can be simplified by recognizing that after turning off all independent sources (including capacitor-current and inductor-voltage sources), the circuit is reduced to a purely resistive network. In this case, a given diagonal term of the connection matrix is simply the sum of the corresponding resistor link with the other resistor members of its loop. Stated another way, a diagonal term is the Thevenin resistance between the terminals of the corresponding tear with all other resistor links also torn.

The value of a given off-diagonal term is a function of the respective loop equations for the ith link and the jth link, where i is the index of the ith row of the matrix and j is the index of the jth column. The magnitude of the off-diagonal term, $R_{ij}$, is the sum of all resistances common to the ith and jth loop equations. The sign of the term is positive if the signs of the common terms in both loops equations are the same, otherwise the sign is negative.

For example, consider again the circuit of FIG. 19 containing three resistor links. With all resistor links torn, all link capacitors open, and all inductors shorted, the following loop equations result for each link:

$$\begin{aligned} V_{R6} &= -V_{R1} - V_{R2} \\ V_{R7} &= V_{R1} - V_{R4} \\ V_{R8} &= V_{R1} + V_{R2} + V_{R3} - V_{R4} - V_{R5} \end{aligned} \quad (6)$$

To formulate the connection matrix, the resistors involved in each equation are summed to yield the positive diagonal terms. Next, the set of resistors for each diagonal term are intersected to yield the strict upper and lower triangles. For FIG. 19, the resulting matrix is (the matrix is symmetric with a positive diagonal):

$$\begin{bmatrix} R_1 + R_2 + R_6 & -R_1 & -(R_1 + R_2) \\ -R_1 & R_1 + R_4 + R_7 & R_1 + R_4 \\ -(R_1 + R_2) & R_1 + R_4 & R_1 + R_2 + R_3 + \\ & & R_4 + R_5 + R_8 \end{bmatrix} \quad (7)$$

Once the connection matrix is formulated, it is factored into LU form using any suitable method of decomposition. Since the matrix tends to be dense, sparse matrix procedures will not usually yield improvements in the factorization. This limits the usefulness of the node tearing approach since, for dense matrices, the computational complexity is proportional to m³ and the memory requirements are proportional to m², where m is the number of resistor links.

After the connection matrix has been formulated and factored, moment generation may commence as described above, but each moment generation must now be performed in two passes. First, the circuit as shown in FIG. 19, for example, is solved with the resistor links treated as zero-valued current sources, i.e., electrically open. The resulting open circuit voltages ($v_{oc}$) are used as the right hand side of equation (5) and then forward- and back-substitution is performed to yield the resistor link currents. These currents are then substituted back into the circuit as current sources in place of their corresponding resistor link. Finally, the circuit is resolved to yield the final DC solution according to the procedures described in sections 8.A.1-5.

8.B.1 Single Traversal Technique-Virtual Path Tracing, 60, 70

In the first embodiment of the invention hereinabove described in sections 8.A.1-6, the computation of each generation of circuit moments as shown by Block 70 required repeated traversals of the directed graph, Block 60. Moreover, a node-tearing technique was used to handle the problem of resistor loops. This technique provided that for near tree-like circuits, only portions of the F-matrix would have to be computed. As described in the article by Pillage, Ratzlaff and Gopal, entitled *RICE: Rapid Interconnect Circuit Evaluator*, presented at the 28th ACM/IEEE Design Automation Conference, San Francisco, Calif., June 1991, the disclosure of which is hereby incorporated by reference, circuit topologies which deviate from a pure tree structure can be collapsed to the smallest possible F-matrix solution problem. Thus, complete or explicit F-matrix treatment, which has non-linear complexity and tends to dominate run time is not required.

As will be understood by one skilled in the art, pure tree topologies-include all RLC circuits for which a spanning tree of the circuit can be constructed without the need to include resistors, inductors, or voltage sources as links of the spanning tree. To improve upon the node-tearing and repeated traversal requirements described above, a second embodiment includes (1) virtual path tracing so that only a single actual traversal would be required and (2) circuit compaction to handle the problem of resistor loops.

As described more fully below, virtual path tracing improves efficiency by removing much of the graph traversal overhead from the path tracing technique. This is important since the graph is traversed many times to produce all required moment generations. The technique also reduces the likelihood that memory page-faults will occur during the virtual path traces and considerably improves the run time for generating a circuit simulation.

The basis of virtual path tracing is that an interconnect circuit need only be actually path traced one time regardless of the number of moment generations required. Since neither the circuit graph nor spanning tree changes between each generation, the nodes will be visited in the same order during each moment generation. This suggests that instead of executing an actual or explicit traversal of the directed graph and tree for each additional set of moments, only a single actual traversal is required to memorize the location and order of the links and tree branches. As explained more fully hereinbelow with reference to FIGS. 7 to 12, all data is organized into simple vectors and accessed in sequential order to guarantee maximum efficiency.

Figure 6:
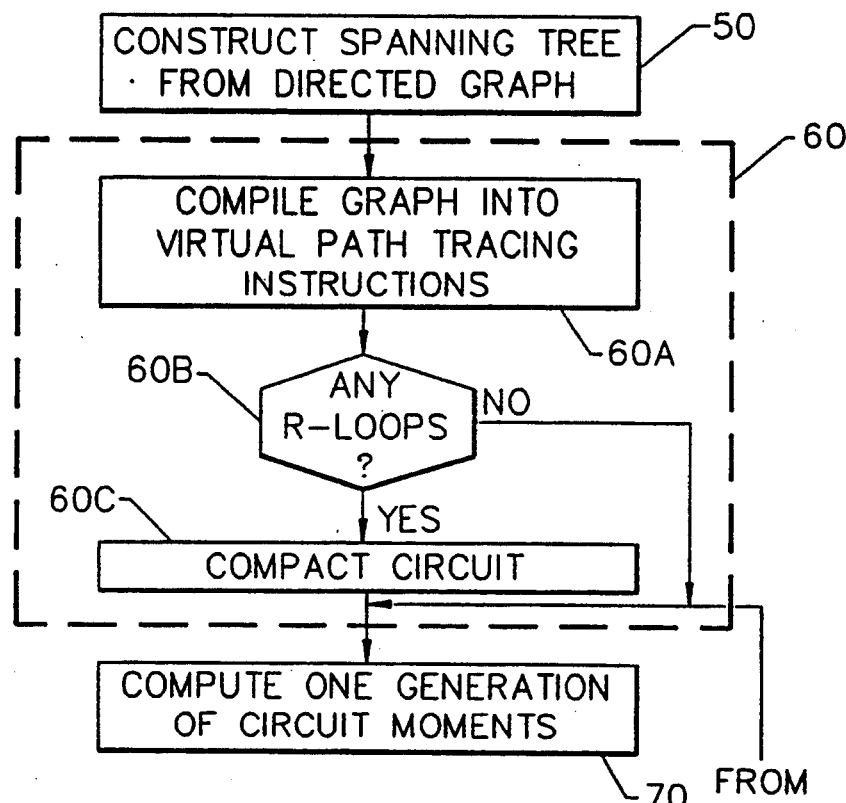
FIG. 6 illustrates operations for performing a repeated traversal of the spanning tree through virtual path tracing and circuit compaction to handle resistor loops.
Figure 7:
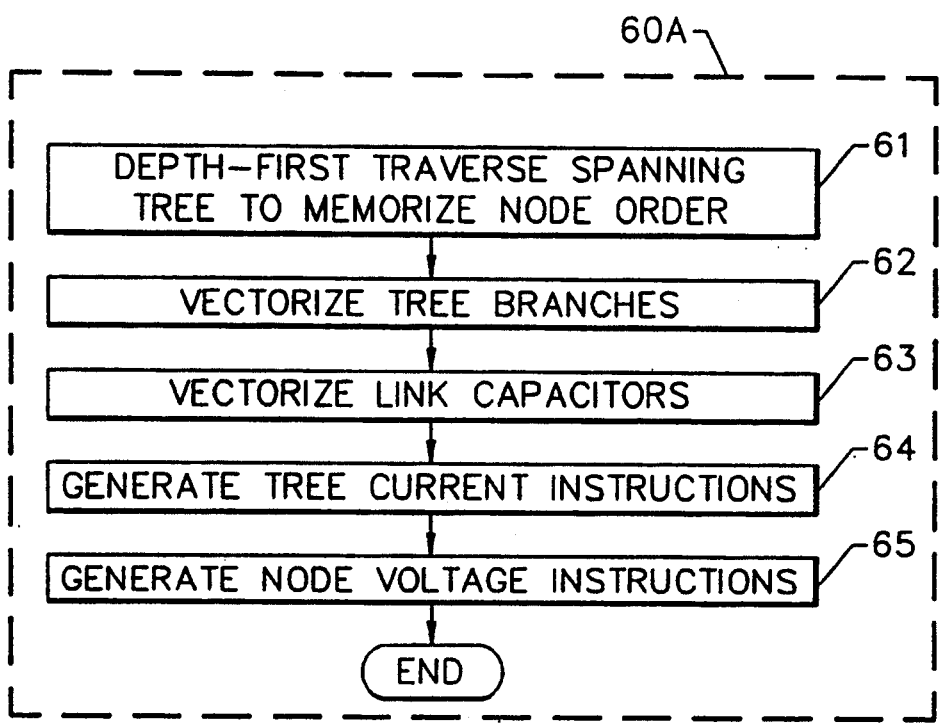
FIG. 7 illustrates operations for generating the virtual path tracing instructions illustrated in FIG. 6.

Referring now to FIG. 6, Block 60 of FIG. 3 includes the steps of compiling the graph and generating virtual path tracing instructions, Block 60A. This is followed by a determination of the presence of resistor loops, Block 60B, and circuit compaction if resistor loops are found, Block 60C. If no resistor loops are found, the process continues with the first generation of circuit moments, Block 70. As will be understood by one skilled in the art, all moments can be calculated at one time and stored for later use during the moment shifting procedure.

8.B.2. Compiling the Directed Graph into virtual Path Tracing Instructions, 60A Referring now to FIG. 7, a depth-first traversal of the spanning tree is performed to memorize the node order and create an integer nodelist vector, Block 61, containing the internal node numbers. Referring again to the example interconnect circuit shown in FIG. 18(c), the corresponding nodelist is:

| 0, | 1, | 2, | 5, | 6, | 7, | 3, | 4 |
|---|---|---|---|---|---|---|---|

As will be understood by one skilled in the art, sequentially visiting the nodes from left to right results in a forward traversal of the spanning tree while visiting from right to left reverses the traversal. The index of a node in the nodelist also corresponds to the index of corresponding data relating to the node (e.g., node voltage) and the node's respective inward branch (e.g., current). For example, indexing the node voltage vector with 4 (indices began at zero) returns the voltage of node 6. Once the node list has been generated, the directed graph is further compiled by creating a tree branch vector, Block 62, and a link capacitor vector, Block 63, as explained more fully below. Following this, the tree current instructions, Block 64, and node voltage instructions, Block 65, are generated.

8.B.2.1. Vectorize the Tree Branches, 62

Figures 8, 9:
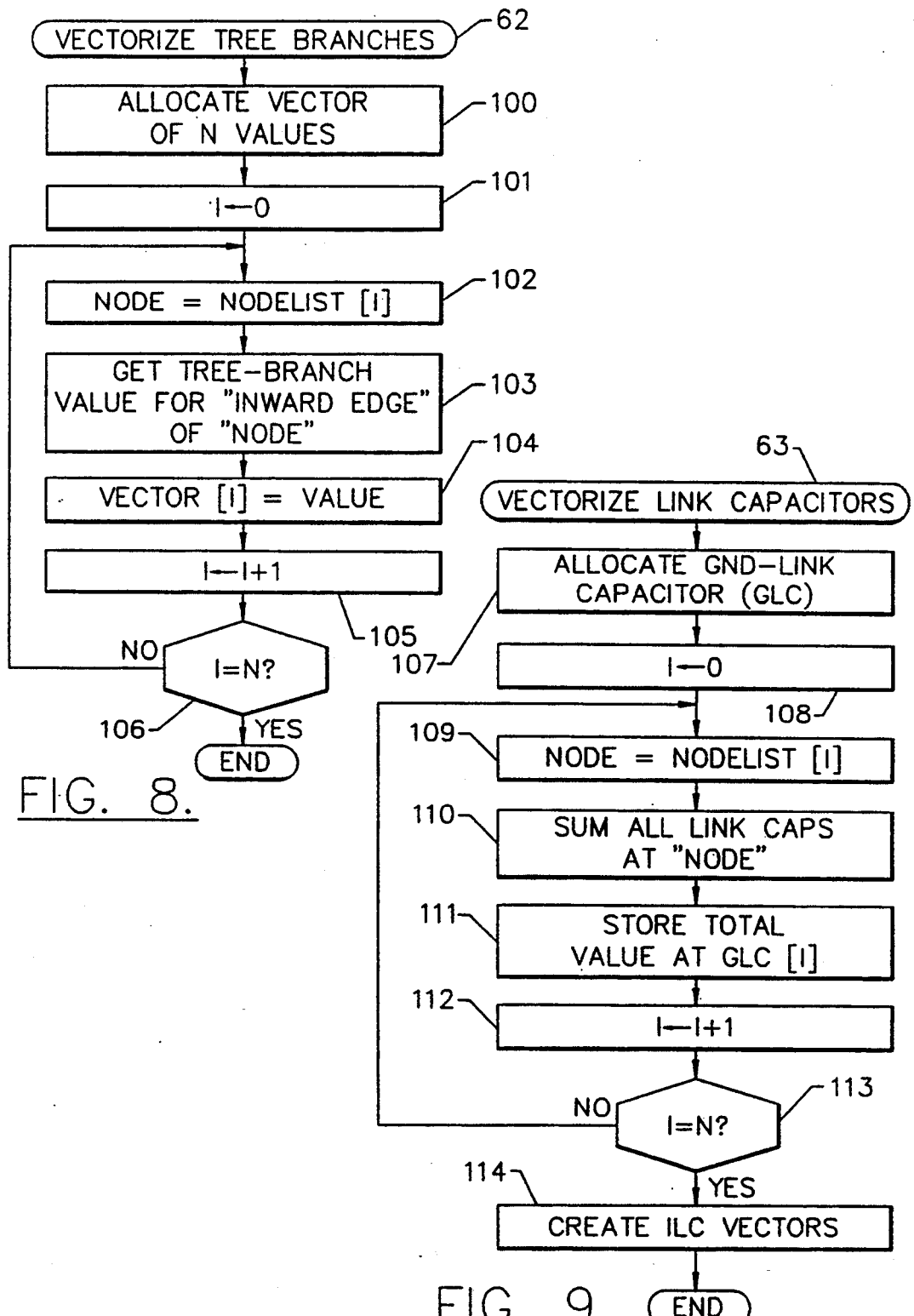
FIG. 8 illustrates operations for vectorizing the tree branches illustrated in FIG. 7.
FIG. 9 illustrates operations for vectorizing the link capacitors illustrated in FIG. 8.

Referring now to FIG. 8, a vector containing an indexed list of tree branch values is created by first allocating a vector of size N (where N is the number of nodes including the ground node), Block 100, and initializing the Index I to zero, Block 101. Because there is a one-to-one correspondence between inward tree branches and nodes, it is possible to vectorize the tree branches by selecting the value of each inward branch component and entering it into a vector whose indices correspond to those in the nodelist. The tree branch vector is required so that resistor voltage drops and inductor voltages may be computed via vector-vector multiplication. Referring again to FIG. 18(c), the corresponding tree branch vector would be

| X | $-V_{is}$ | $R_1$ | $L_1$ | $R_2$ | $L_2$ | $L_3$ | $R_3$ |
|---|---|---|---|---|---|---|---|

The ith entry (indices begin at zero) in this list specifies the inward branch component value for the ith node in the nodelist vector. The operations for vectorizing the tree branches are illustrated in Blocks 102–106 of FIG. 8. Thus, once the Index I is initialized to zero, the first node, node 0, is selected from the nodelist, Block 102. The tree branch for the inward edge of node 0 is then selected, Block 103, and the value of that branch is transferred to the vector in the space allocated for the particular node, Block 104. Next, the index is incremented, Block 105, and compared to see if all nodes have been selected, Block 106; if not, the next corresponding tree branch for the next nodelist entry is selected and the process is repeated until all three branches have been gathered.

8.B.2.2. Vectorize the Link Capacitors, 63

Referring now to FIG. 9, the vectorization of link capacitor values is performed in two phases. First the ground-link capacitance (GLC) vector is prepared, Blocks 107–108. Each entry of this vector is the sum total of all link-capacitances at a given node and each entry is organized according to the order of the nodelist. Each total includes not only the grounded capacitance, but also the internodal-link capacitance (ILC). The steps for filling the GLC, shown by Blocks 109–113, are similar to those described hereinabove with regards to Blocks 102–106. The GLC vector for the circuit shown in FIG. 18 would contain the following entries: $[0, 0, 0, C_1, 0, C_2+C_4, 0, C_3+C_4]$. Zeros in the list correspond to nodes with no incident capacitors.

The second phase of the vectorization occurs if ILCs are present, Block 114. For the example shown in FIG. 18, a single ILC ($C_4$) is present.

Figure 10:
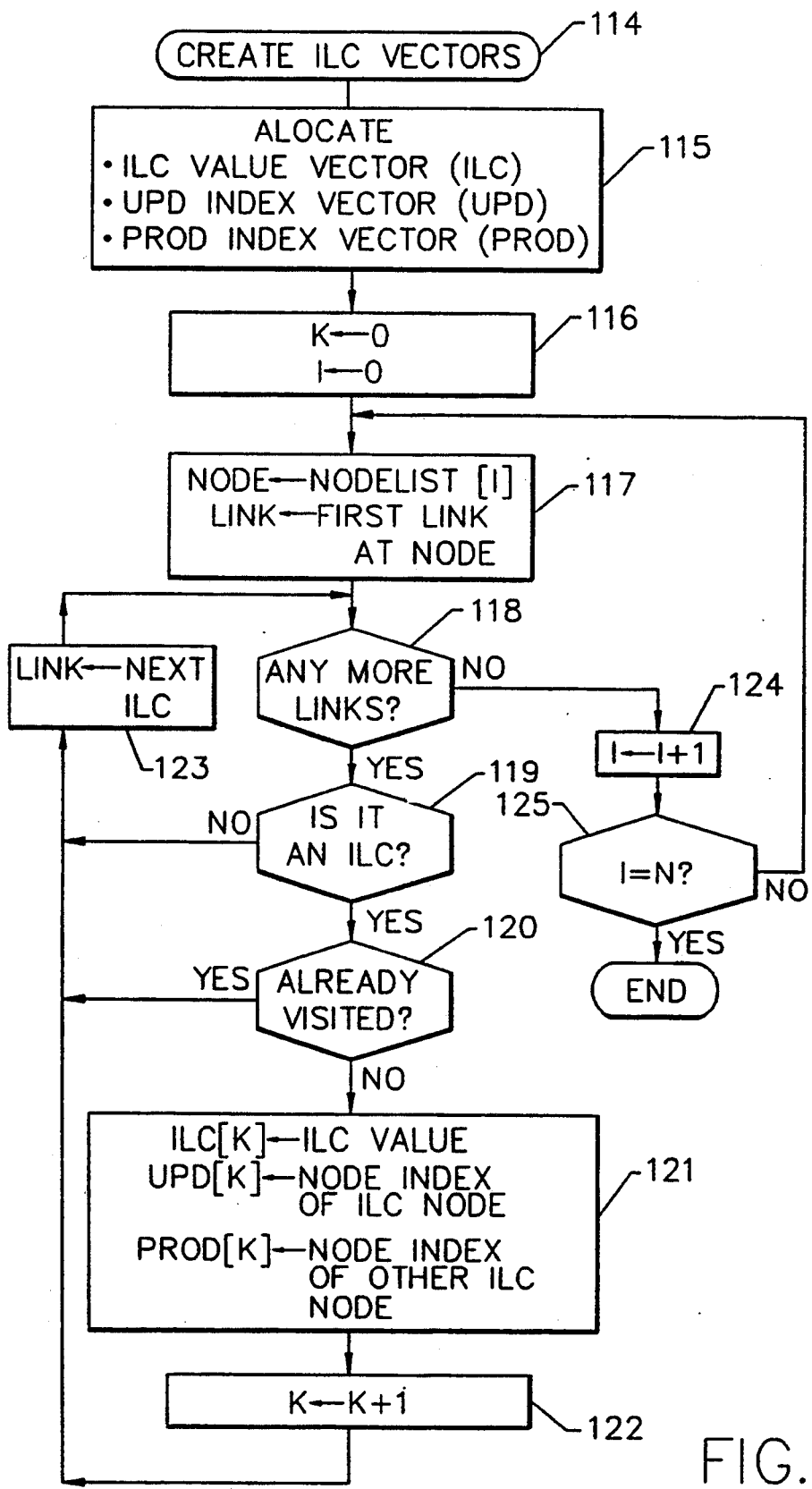
FIG. 10 illustrates operations for creating the ILC vectors illustrated in FIG. 9.

Referring now to FIG. 10, the second phase of link capacitor vectorization will be described. As shown by Block 115, three vectors are created during this phase. The first vector (ILC) contains an entry corresponding to the capacitance value of each ILC. The second vector (UPD) and third vector (PROD) contain entries for the respective node index of the ILC capacitor terminals. The length of these vectors equals the number of ILCs in the circuit; for the circuit shown in FIG. 18, there is only one ILC ($C_4$), therefore vectors (ILC), (UPD), and (PROD) have only a single entry. The corresponding entries are $C_4$, 5 (node 7), and 7 (node 4), respectively.

Referring now to Block 116, the nodelist index (I) and ILC vector index (K) are initialized to zero. In Block 117, the node corresponding to the ith entry in the nodelist vector and the first link connected to that node are selected. If there are no more links connected to that node, the index is incremented, Blocks 118, 124–125. If the final node has not been reached, a new node is selected, Block 117.

If after passing through Block 118 there are more links, a check is performed to see if the link is an ILC, Block 119. If it is, a check is performed to see if the particular ILC has already been visited, Block 120. If not, the (ILC), (UPD), and (PROD) vectors are updated to include the ILC value and both connecting nodes, Block 122. Next, the index for the ILC vector is incremented to prepare for the next ILC encounter, if any, Block 122. The next ILC is then selected, Block 123, and the process repeats itself if there are additional links and ILCs connected to those links, Blocks 118–119.

8.B.2.3. Generate Tree Current Instructions, 64

Figure 11:
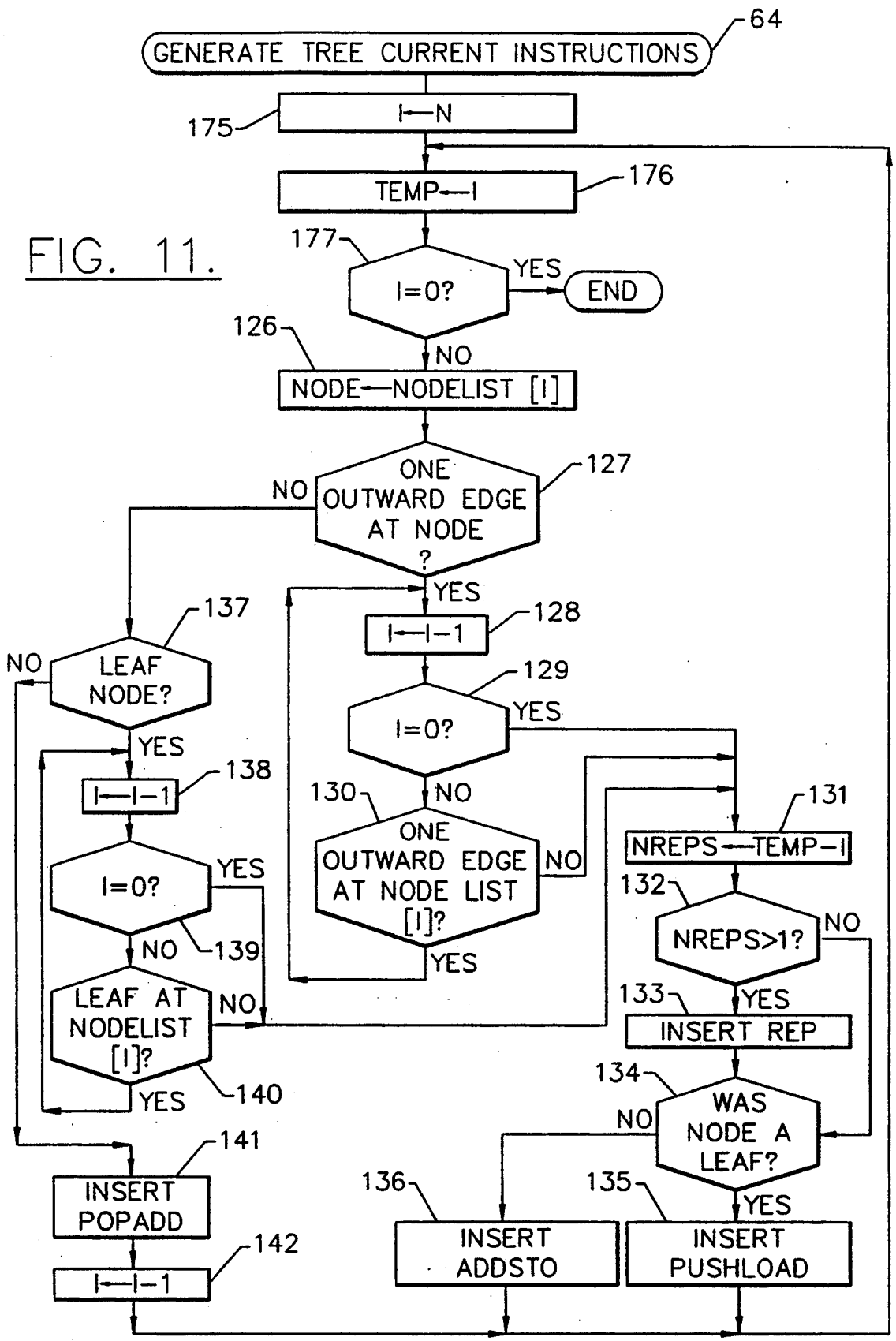
FIG. 11 illustrates operations for the generating tree current instructions illustrated in FIG. 7.

Referring now to FIG. 11, the operations for generating a set of pseudo-instructions to be used in performing the reverse path trace for calculating tree branch currents will be described; TABLE 10 shows a compressed pseudo-code instruction list for implementing a virtual reverse path trace of the circuit shown in FIG. 18. As will be understood by one skilled in the art, the information contained in a given instruction list is the same information that would be obtained by performing a depth-first search of the spanning tree as described above, but the information is optimized so repeated use of it results in substantially improved performance.

For example, if actual path traces were used to compute the DC solution, floating point operations would be required at each node and repeated traversals of each tree branch would be required. The pseudo-instructions shown in TABLE 10 are stored as integer words and are interpreted to control the reverse and forward traces. As will be further understood, these pseudo-instructions are portable to other microprocessors through translation once the target processor is known. The use of stack primitives as shown in TABLE 10 are not required but their use is desirable to maintain the highest level of data vectorization in order to minimize page faulting, for example.

Beginning with Block 175, the index I is set to N, where N denotes the number of circuit nodes; referring again to the example interconnect circuit shown in FIG. 18, N equals eight (8). Next, the TEMP value is set to the current index value, Block 176. If the index I is not zero, the node corresponding to the index value is selected from the nodelist vector, Block 126, otherwise the generation of instructions is completed, Block 177. At Block 127, a check is performed to see if there is only one outward edge extending from the particular node. Referring again to the example, an initial index of eight (8) would correspond to node 4. Since there are no outward edges extending from node 4, a decision is made at Block 137; since node 4 is a leaf node, the index is decremented to seven (7), Block 138. Since node 3 is not a leaf node, Block 140, the value NREPS is set to one (1), Block 131–132. The node value is then checked to see if node 4 was a leaf node, Block 134. Since node 4 is a leaf node, the first pseudo-instruction PUSHLOAD is generated corresponding to node 4, Block 135.

Next, the value TEMP is set to seven (7) to correspond to the decremented index from the first pass, Block 176. The node value is set to three (3), Block 126, and a check is made to see if node 3 has one outward edge, Block 127; since node 3 has one outward edge the index I is decremented to six (6) and node 7 is checked to see if it has one outward edge, Blocks 128–130. Since node 7 is a leaf node, no outward edges are present and NREPS is set to one (1), Block 131, and the pseudo-instruction ADDSTO is generated corresponding to node 3, Blocks 132, 134, and 136. The procedure is repeated again, this time for node 7, corresponding to index six (6), and another PUSHLOAD instruction is generated. For nodes 6 and 5 (indices 5, 4), a REP 2 ADDSTO instruction is generated, Blocks 127–130, 128–130, 131–134, 136. For node 2 (index 3), a POPADD instruction is generated, Blocks 127, 137, 141–142. The steps are repeated for indices 2 and 1 to generate a REP 2 ADDSTO instruction.

TABLE 10

Compressed Tree-Current Mnemonics

| Node(s) | Instruction(s) |
|---|---|
| 4 | (Push)Load |
| 3 | AddSto |
| 7 | PushLoad |
| 6,5 | Rep 2 AddSto |
| 2 | PopAdd |
| 2,1 | Rep 2 AddSto |

Instruction Definitions

| | | |
|---|---|---|
| PushLoad | $(S) \leftarrow A$; | // store accumulator at stack pointer |
| | $S \leftarrow S + 1$; | // increment stack pointer |
| | $A \leftarrow (L)$; | // load accumulator with next link current |
| | $L \leftarrow L - 1$; | // decrement link current pointer |
| AddSto | $A \leftarrow A + (L)$; | // add link current to accumulator |
| | $(L) \leftarrow A$; | // and replace it |
| | $L \leftarrow L - 1$; | // decrement link current pointer |
| PopAdd | $S \leftarrow S - 1$; | // decrement stack pointer |
| | $A \leftarrow A + (S)$; | // add top-of-stack to accumulator |

Operand Definitions

| | |
|---|---|
| A | Floating-point accumulator |
| S | Stack pointer |
| (S) | Floating-point value at stack-pointer location |
| L | Link-current vector pointer initially set to point to total link current of last node in the nodelist. |
| (L) | Floating-point value at link-current pointer location |

After all instructions have been executed, L will point to the forward list of tree-branch current totals.

8.B.2.4. Generate Node Voltage Instructions, 65

Figure 12:
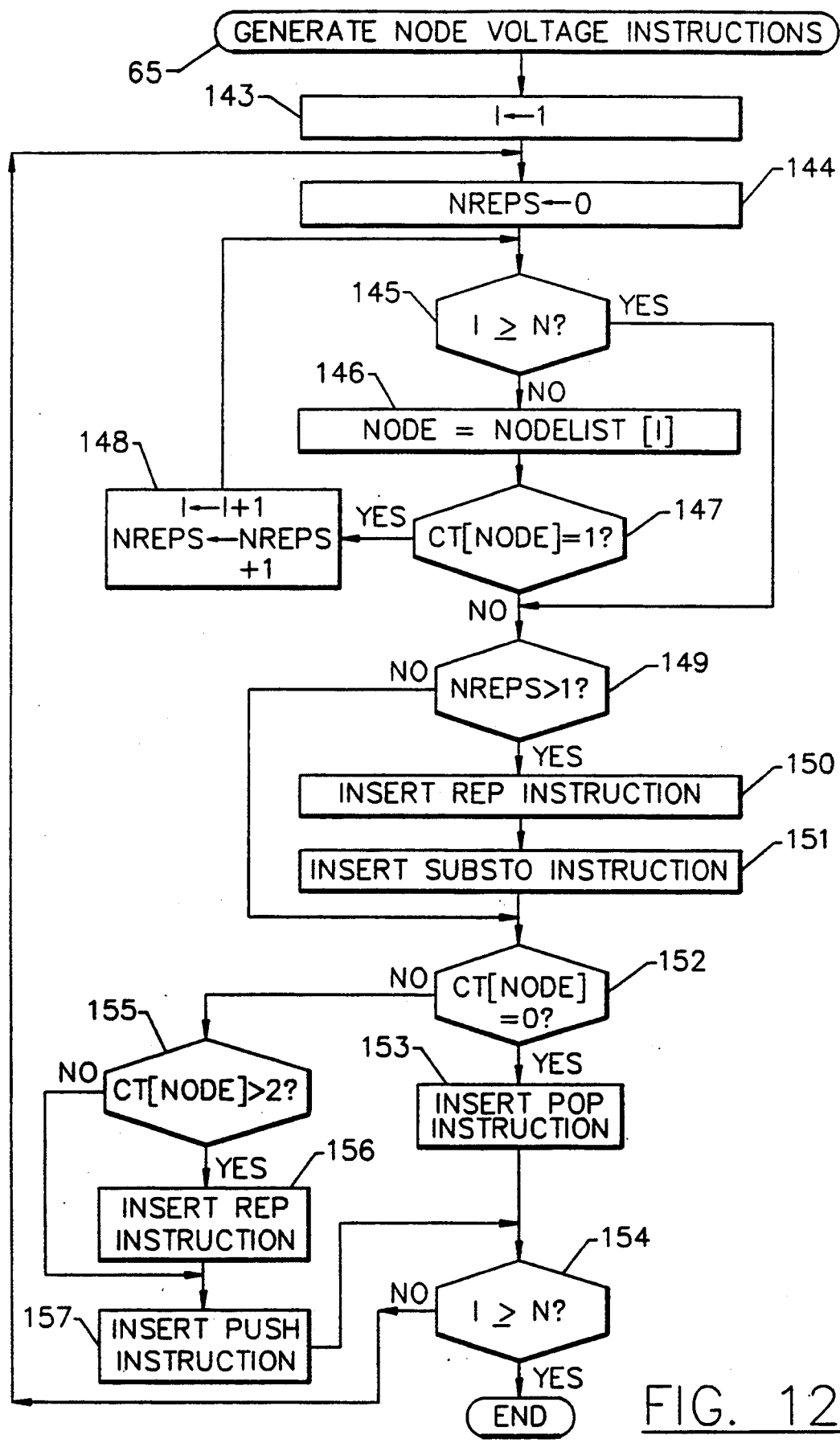
FIG. 12 illustrates operations for generating the node voltage instructions illustrated in FIG. 7.

Referring now to Figure 12, the steps for generating pseudo-instructions for performing the forward path trace to compute node voltages will be described. Beginning with Block 143, the index I is initialized to one (1) corresponding to the ground node 0. During the first pass the instruction PUSH is generated, Blocks 143–148, 145–147, 149, 152, 155, 157, 154. The steps are repeated until the forward path trace has been completed. In FIG. 12, CT[NODE] equals the number of outward edges at a node. The corresponding pseudo-instructions for the forward trace of the example circuit are provided in TABLE 11. Once the circuit compilation is completed, the directed graph and spanning tree are no longer needed to compute the circuit moments. Instead, the set of pseudo-instructions for computing the tree branch currents and node voltages are compiled and used for performing the virtual path trace.

8B.3. Compact Circuit, 60C

Now referring again to FIG. 6, the steps for compacting the interconnect circuit having resistor loops (links) will be described. Resistor loops—resistors to ground or resistor meshes—present special problems for the virtual path tracing techniques described hereinabove because the currents in the links are not known a priori and cannot be readily calculated.

According to one aspect of the present invention, circuit compaction is a technique whereby the number of nodes in the circuit is substantially reduced by eliminating many or all of the nodes which have no incident resistor links using the techniques of current-source transportation, voltage-source transportation and the formation of Norton equivalent subcircuits. Thus, the circuit is compacted such that the original resistor loops are left intact but Norton-equivalent subcircuits are

TABLE 11

Compressed Tree-Current Mnemonics

| Node(s) | Instruction(s) |
|---|---|
| 0 | Push |
| 1,2 | Rep 2 Substo |
| 2 | Push |
| 5,6,7 | Rep 3 Substo |
| 7 | Pop |
| 3,4 | Rep 2 Substo |
| 4 | Pop |

Instruction Definitions

| | | |
|---|---|---|
| Push | $(S) \leftarrow A$; | // store accumulator at stack pointer |
| | $S \leftarrow S + 1$; | // increment stack pointer |
| Pop | $S \leftarrow S - 1$; | // decrement stack pointer |
| | $A \leftarrow (S)$; | // load accumulator with value at top-of-stack |
| Substo | $A \leftarrow A - (T)$; | // subtract tree-branch voltage from accumulator |
| | $(T) \leftarrow A$; | // replace tree-branch voltage with node voltage |
| | $T \leftarrow T + 1$; | // advance branch/node pointer |

Operand Definitions

| | |
|---|---|
| A | Floating-point accumulator |
| S | Stack pointer |
| (S) | Floating-point value at stack-pointer location |
| T | Tree-branch/node voltage vector pointer initially set to point to first inward branch voltage |
| (T) | Floating-point branch or node voltage | substituted for the remaining sections of the circuit between the loops.

Once the compact circuit is formed, a conduction matrix for the compact circuit is formulated and factored using Cholesky decomposition. As explained more fully below, the currents of the resistor loops in the compact circuit are initially calculated prior to each moment generation. Once these currents are obtained, they are substituted back into the original circuit so that virtual path tracing can be completed.

8.B.3.1 Map Nodes to compact circuit and Find Norton Resistances, 158-159

Figure 13:
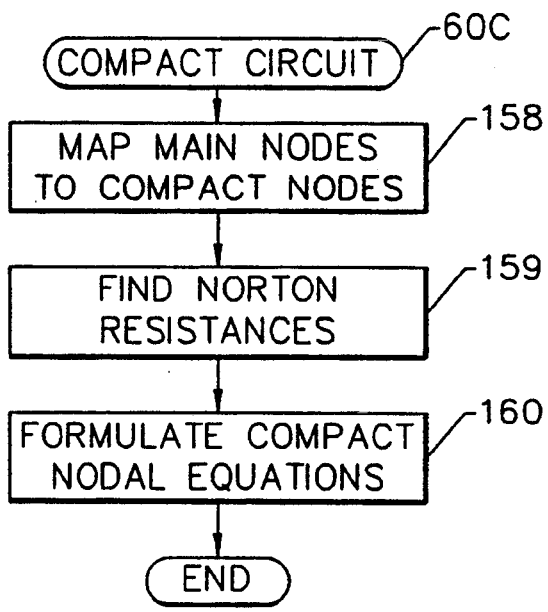
FIG. 13 illustrates operations for compacting the circuit nodes illustrated in FIG. 6.

Referring now to Block 158 in FIG. 13, all nodes in the interconnect circuit having at least one incident resistor link or nodes that root two or more subtrees containing resistor links are retained by mapping these nodes to the compact circuit. This is shown, for example, in the article entitled *RICE: Rapid Interconnect Circuit Evaluator*, cited previously. This mapping requirement guarantees that the mutual effects of resistor links on one another are the same in the compact circuit as in the main circuit. A node which roots two or more subtrees, where only one subtree contains one or more links need not be retained since the effects of these subtrees will be reflected in the Norton currents. Similarly, a node the which roots two or more subtrees with no resistor links may be discarded.

Referring now to Block 159, once the nodes to be retained are determined, the Norton resistances may be found by summing all resistor values along the spanning tree between the retained (mapped) nodes. This is accomplished by a depth-first traversal (using the nodelist) of the spanning tree. Each time a node to be retained is encountered, the resistance total is reset and accumulation of Norton resistance continues until the next retained node is encountered.

Voltage sources (inductors) in the circuit present an obstacle because if one or more inductors are connected between the retained nodes without the presence of a series resistance, a Norton equivalent cannot be generated directly because the Norton conductance would be infinite. This problem can be solved, however, by using voltage source transportation to transport the source forward into the incident tree branch and any incident resistor links.

8.B.3.2 Formulate Compact Nodal Equations, 160

After finding the compact circuit, the conductance matrix (G-matrix) is formulated representing the equations required for nodal analysis. For typical circuit models, the matrix will be very sparse. Additionally, the matrix will be symmetric and positive-definite since it represents a real passive linear system. The sparsity, symmetry, and definiteness allows a very efficient Cholesky decomposition to be performed in lieu of a standard LU-decomposition.

According to the invention, the sparse matrix is formulated in a symbolic fashion. In other words, the resulting sparse matrix represents the topology of the matrix, but contains no numerical data. Next, a Reverse Cuthill-McGee (RCM) procedure is applied to reorder the matrix so that subsequent fill-ins are reduced. The RCM procedure generally produces a relatively narrow envelope about the diagonal of the symmetric matrix. This envelope can be efficiently stored and operated upon in a vectorized fashion, thus avoiding general sparse-matrix techniques. This allows the subsequent Cholesky decomposition to be performed very efficiently.

8.C.1. Compute One Generation of Circuit Moments, 70

Figure 14:
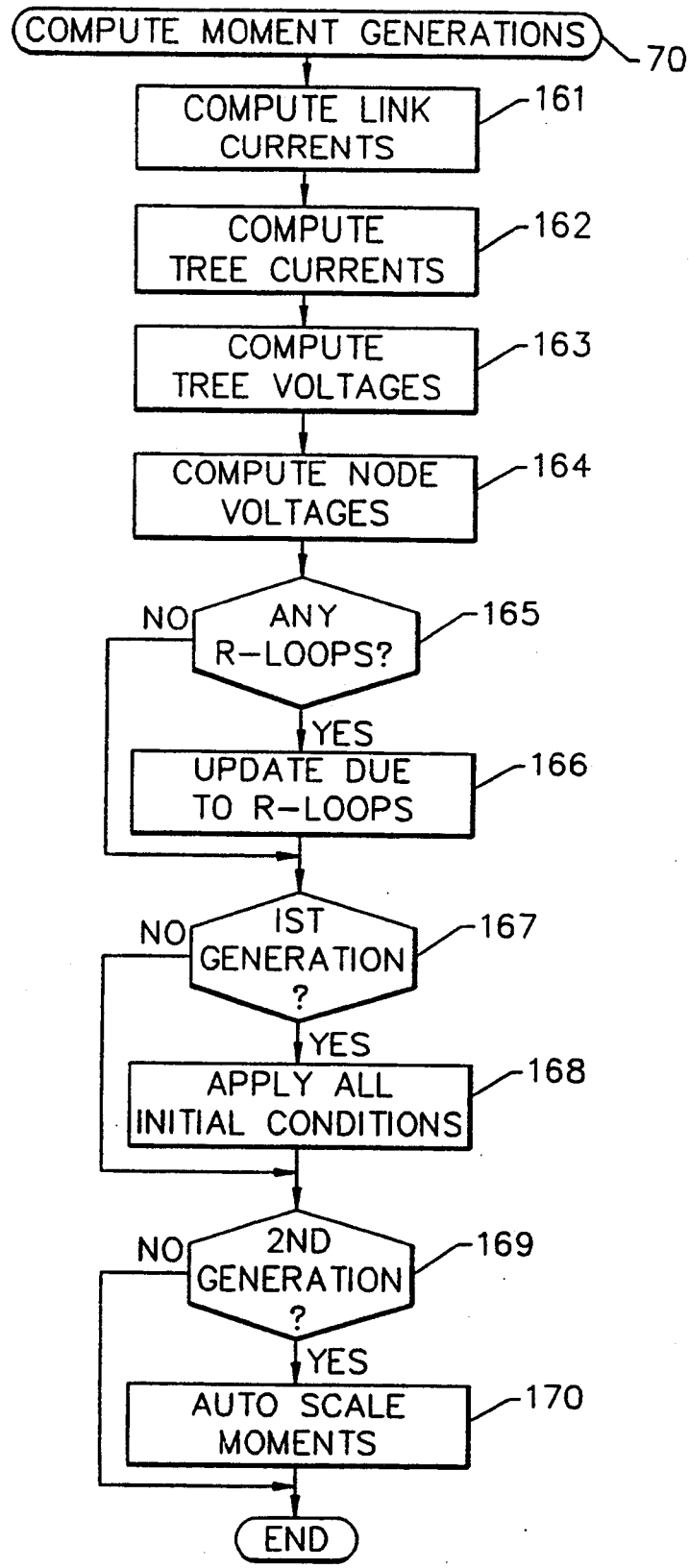
FIG. 14 illustrates operations for compacting a generation of circuit moments as illustrated in FIG. 3.

Referring now to FIG. 14, the operations for computing one generation of circuit moments will be described. The technique for resolving each generation of capacitor link currents to create a link current vector, Block 161, begins with the replacement of all link capacitors in the original circuit with DC current sources as shown in FIG. 18(*b*). These current sources are initially set to zero, i.e., electrically open. The value given to the current source is the product of the capacitance and the value of the previously generated moment. The moment of a capacitor is the voltage across its assigned current source.

Referring now to Block 162, the tree currents are resolved by performing a virtual reverse path trace using a compiled version of the pseudo-instructions described in section 8.B.2.3 to produce a vector of branch currents. The instructions control all floating point operations applied to the link current vector.

Referring now to Block 163, a vector of tree branch voltages is generated by first overwriting all previous inductor currents (moments) with the new inductor currents. Next, a vector-vector multiplication of the tree branch values vector with the tree-branch current vector (Block 162) is performed to produce all tree branch voltages.

The node voltages can be resolved (Block 164) by performing a forward virtual path trace (the beginning node is ground) using a compiled version of the pseudo-instructions shown in TABLE 11, for example, to produce a vector of node voltages as described in section 8.B.2.4. The node voltage are computed using the tree branch voltages vector previously computed.

If resistor loops are present, an update of the branch currents and node voltages is performed, Blocks 165-166; otherwise, initial conditions will be applied if a first generation of moments are being calculated, Blocks 167-168. As explained above in section 8.A.1, the second generation of moments are scaled, Blocks 169-170.

8.C.2. Updating if Resistor Loops are Present, 166

As explained in sections 8.B.3.1-2, formulating the compact circuit and factoring the conductance (G) matrix are performed only once. The solution of resistor loop currents, however, must be performed during each moment generation. As will be understood by one skilled in the art, the resistor link currents depend only upon the value of the Norton-equivalent current sources in the compact circuit and the conductance matrix. Thus, in order to perform the DC analysis of the compact circuit for each moment generation, the Norton current sources must be derived indirectly using virtual path tracing with all the resistor loops torn out to obtain the voltages across the nodes of the resistor loops, followed by the multiplication of these voltages with the corresponding conductance appearing between the respective nodes in the compact circuit.

Figure 15:
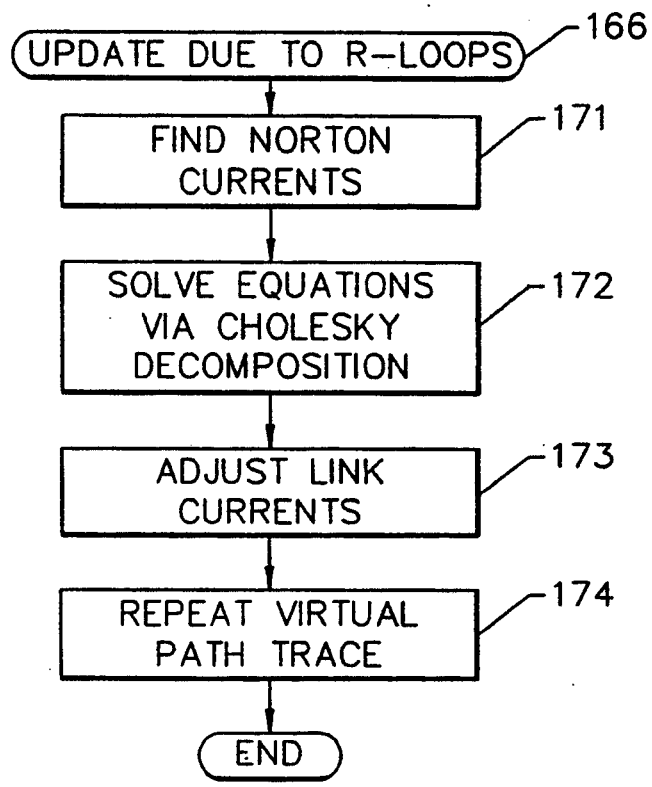
FIG. 15 illustrates operations for updating the node voltages to account for resistor loops as illustrated in FIG. 14.

Referring now to FIG. 15, the multiplication produces the Norton equivalent current source values, Block 171. Next, the resistor links are placed back into the compact circuit and the Norton current sources are stenciled into the right hand side (RHS) of the G-matrix. Through forward and back substitution, Block 172, the node voltages are again computed to indirectly yield the loop (link) currents. These loop currents become the value of the equivalent current sources substituted for each resistor link, respectively, Block 173. Following this, a virtual path trace of the original circuit (with the current source substitution of the resistor links) is performed to obtain a final set of moments for the particular generation, Block 174.

9. Map Moments to Dominant Time Constants, 80

As described above, AWE provides an accurate means of simulating RLC interconnect circuits at speeds 10,000 times faster than conventional circuit simulators such as SPICE by approximating the circuit's actual transient response with that of the modelled response. The model is constructed using the circuit's q most dominant poles, obtained by calculating the first 2 q moments.

Unfortunately, although AWE is a generalized technique and provides an efficient means for modelling all sorts of linearized circuits, a practical application of AWE's moment-matching technique for generating a qth order model is limited in at least two areas. First, the AWE technique does not provide a means for determining, in advance, the number of moments or poles needed, since the determination of whether a pole is dominant or not cannot be determined a priori. If it is determined that additional poles (or moments) are needed to reach the desired degree of model accuracy, the entire process of moment, pole and residue calculation, must be repeated. Second, with AWE, it may not even be possible to select a desired order of approximation because of problems with instability, i.e., generating positive poles for a stable circuit.

The instability associated with AWE's pure-Padé approach to moment calculation can generally be attributed to two phenomena: (1) numerical noise, and (2) the location of high frequency poles or masking zeros in the impulse- and step-function responses. With regards to (1), it is recognized that the calculation of each generation of moments is computationally intensive and the presence of numerical noise with each moment can cause a shift in the calculated pole values to the right-half plane. This problem, known as numerical instability, can be overcome by constraining the mapping of the moments to the poles, as explained below, or by increasing the degree of computational precision associated with each generation of moment calculation.

With regards to (2), the problem is more serious and represents inherent instability. Although it would appear that increasing the order of approximation would eliminate this form of instability, increasing the order also gives rise to a greater likelihood of numerical instability with respect to the calculation of higher order poles.

Thus, according to one aspect of the present invention, a constrained optimization technique is used to map moments to stable (negative) dominant time constants. According to another aspect of the present invention, a preferred moment shifting technique is described that results in a partial-Padé approximation.

9.A. Constrained Approximation Technique, 80

According to one aspect of the present invention, a constrained nonlinear optimization procedure is used to map the moments to the dominant time constants. By focusing on linear RC interconnect circuits, this approach guarantees stability by constraining the solution to the left half plane (LHP). A discussion of constrained mapping is provided in an article entitled *Constrained Approximation of Dominant Time Constant(s) in RC Delay Models*, written by Pillage, Gopal and Ratzlaff and presented and published at the 13th IMACS World Congress on Computation and Applied Mathematics, Dublin Ireland, Jul. 22-26, 1991, the disclosure of which is hereby incorporated herein by reference.

Using constrained mapping, the system time constants $\tau_q$ are guaranteed to be negative by using a transformation of variables such as, for example $\tau_q = -\exp(x_q)$ which effectively transforms the constrained system into an unconstrained one. The resulting equations in $x_q$ can now be optimized using more powerful unconstrained schemes such as Newton-Raphson iteration.

9.B.1. Moment Shifting Technique—A Partial-Padé Approach, 80

In order to generate an accurate model for a given RLC circuit, it is generally necessary to know the frequency range of the normally applied input or excitation signals since it is sometimes the case that lower order models cannot accurately reconstruct the actual transient response to input or excitation signals having high frequency components such as a step input. It is well known to the art that an ideal impulse excitation has more dominant high frequency components than would a step, ramp, quadratic, or cubic, etc., in that order.

According to this aspect of the present invention, the high frequency components of the excitation signal are de-emphasized by shifting each of the 2 q moments before mapping them to the dominant pole approximations. In the frequency domain, this has the effect of moving the high frequency zeros towards the high frequency poles, thus making the corresponding high frequency poles less dominant. In the time domain, this has the effect of making the residue for the particular high frequency pole smaller.

As will be understood by one skilled in the art, however, the actual system poles are invariant to frequency changes in the input or excitation signal. Thus, the characteristic transfer function $H_q(s)$ is unchanged by the moment shifting procedure.

Once the dominant pole approximations have been calculated for the lower frequency input signals, such as a ramp, etc., they are fitted to an impulse- or step-response to obtain the corresponding residues. Such an approach constitutes a partial-Padé approximation.

As explained above, it is possible to accurately approximate the time- or frequency-domain response of linear RLC circuits in terms of a reduced q-pole model having the following time and frequency domain forms:

$$h_q(t) = k_1 e^{p_1 t} + k_2 e^{p_2 t} + \ldots + k_q e^{p_q t} \qquad (8)$$

$$H_q(s) = \frac{k_1}{s - p_1} + \frac{k_2}{s - p_2} + \ldots + \frac{k_q}{s - p_q}$$

where $p_1, p_2, \ldots, p_q$ are the dominant pole approximations, and $k_1, k_2, \ldots, k_q$ are the corresponding residues. Such an approximation is possible since the actual response for even a large RLC circuit tends to be dominated by only a few poles.

As described in the article entitled *Asymptotic Waveform Evaluation for Timing Analysis*, by Pillage and Rohrer, cited above, the q dominant poles in Equation (8) are approximated by matching the moments $m_0$ through $m_{2q-1}$ of the exact impulse response with those of the qth order model. This yields the following set of linear equations:

$$\begin{bmatrix} m_0 & m_1 & \cdots & m_{q-1} \\ m_1 & m_2 & \cdots & m_q \\ \cdot & \cdot & & \cdot \\ \cdot & \cdot & & \cdot \\ \cdot & \cdot & & \cdot \\ m_{q-1} & m_q & \cdots & m_{2q-2} \end{bmatrix} \begin{bmatrix} a_q \\ a_{q-1} \\ \cdot \\ \cdot \\ \cdot \\ a_1 \end{bmatrix} = \begin{bmatrix} m_q \\ m_{q+1} \\ \cdot \\ \cdot \\ \cdot \\ m_{2q-1} \end{bmatrix} \quad (9)$$

The roots of the characteristic polynomial formed by the solution of Equation (9):

$$1 + a_1 s + a_2 s^2 + \ldots + a_{q-1} s^{q-1} + a_q s^q = 0 \quad (10)$$

yield the dominant pole approximations.

With a set of dominant-pole approximations $p_1, p_2, \ldots, p_q$, the corresponding q residues are obtained by matching the first q moments, resulting in the linear system:

$$-\left(\frac{k_1}{p_1} + \frac{k_2}{p_2} + \ldots + \frac{k_q}{p_q}\right) = m_0 \quad (11)$$

$$-\left(\frac{k_1}{p_1^2} + \frac{k_2}{p_2^2} + \ldots + \frac{k_q}{p_q^2}\right) = m_1$$

$$-\left(\frac{k_1}{p_1^q} + \frac{k_2}{p_2^q} + \ldots + \frac{k_q}{p_q^q}\right) = m_{q-1}$$

As explained in Sections 8.A.1-6 and 8.B.1-2 the moments are obtained by either a repeated actual traversal of the spanning tree or by using the preferred virtual path tracing technique.

As will be understood by one skilled in the art, the value of the residues corresponding to the high frequency poles decreases as the relative dominance of the low frequency poles increases in response to lower frequency input signals (i.e., signals having most of their signal energy confined to the lower end of their frequency spectrum).

To demonstrate the change in pole dominance in response to lower frequency excitation, consider an nth order RLC circuit with poles $|p_1| < |p_2| < \ldots < |p_n|$. The impulse response to this circuit is given by the expression:

$$H(s) = m_o + m_1 s + m_2 s^2 + m_3 s^3 + \ldots, \quad (12)$$

where $[m_0, m_1, m_2, \ldots]$ represent the moment series, corresponding to the coefficients of $s^0, S^1, S^2 \ldots$, respectively. As will be understood by one skilled in the art, the step input response is given by:

$$Y_{step}(s) = \frac{m_o}{s} + m_1 + m_2 s + m_3 s^2 + \ldots \quad (13)$$

The transient moment set is now given by $[m_1, m_2 m_3, \ldots]$, since the Laplace transform of a step response is $s^{-1}$. The value $m_0$ represents the initial conditions of the circuit. Similarly, for a ramp input, with a Laplace transform of $s^{-2}$, the series expansion of the response is:

$$Y_{ramp}(s) = \frac{m_o}{s^2} + \frac{m_1}{s} + m_2 + m_3 s + m_4 s^2 + \ldots \quad (14)$$

and the transient moment set is given by $[m_2, m_3, m_4, \ldots]$, with initial conditions specified by $m_1$ and $m_o$. As evidenced by these examples, shifting the transient moment set is equivalent to changing the form of the input excitation.

Consequently, using a higher order set of 2 n moments, such as $[m_j, m_{j+1}, \ldots m_{j+2n-1}]$, is equivalent to solving for the exact response to an excitation signal have a transform $s^{-j}$. For this input, the 2 n moment equation yields the exact response:

$$-\left(\frac{k_1}{p_1^{i+j+1}} + \frac{k_2}{p_2^{i+j+1}} + \ldots + \frac{k_n}{p_n^{i+j+1}}\right) = m_{i+j}, \quad (15)$$

$$i = 0, 1, \ldots, 2n - 1$$

which may be rewritten as $$-\left(\frac{\hat{k}_1}{p_1^{i+1}} + \frac{\hat{k}_2}{p_2^{i+1}} + \ldots + \frac{\hat{k}_n}{p_n^{i+1}}\right) = m_{i+j}, \quad (16)$$

$$i = 0, 1, \ldots, 2n - 1$$

where, $$\hat{k}_r = \frac{k_r}{p_r^j}, \quad (17)$$

$$r = 1, 2, \ldots, n$$

Although the response using the shifted moment set has the same poles as the transfer function, the residues are scaled by the quantity $p_r^j$ as shown in Equation (17). Thus, the residues of the high frequency poles are scaled relatively more than those of the low frequency poles as the moment series is shifted to lower frequency input signals.

As will be understood by one skilled in the art, the shift in pole dominance can also be related to the migration of zeros of the response function towards the poles as the high frequency components of the input signal are decreased. This change in the locations of the zeros with the change in the input signal can be used to ensure stability of the reduced-order models by attenuating the dominance of the poles at the high frequency end.

Since the zeros can be moved by shifting the moment series, one aspect of the present invention is to apply a moment shifting procedure to increase the dominance of the low frequency poles before calculating them. Thus, if a qth order approximation of the step response, using Equation (9), is unstable, the transient moment set is shifted and Equation (9) is rebuilt and solved using the shifted moment set. This technique enhances the likelihood that a stable approximation will be achieved with only one or two shifting steps. The only limitation on the number of shifts is that at some point numerical noise is encountered, thus precluding further shifting and eventually suppressing even some of the lower frequency poles of interest.

From equations (13) and (14), it is apparent that repetitive moment shifts may result in the loss of information regarding the initial conditions of the circuit. However, because the initial condition information is contained in the value of the residues, it can be preserved. For example, with a set of stable, dominant pole approximations, the residues are computed using the first $(q-1)$ moments of the step-response along with the initial conditions, in Equation (11). The resultant model would then possess the same first $q$ moments as the exact circuit, thus constituting a partial-Padé approximation rather than a pure-Padé approximation, where the first $2q$ moments are identical.

In terms of implementation, the only moments that need be calculated are the step-response moments of each of the desired response nodes. Convergence to the actual low frequency poles is then observed by resolving Equation (9), with the shifted moments, if shifting is necessary. The residues are then calculated using Equation (11) and the unshifted moments. Thus, while it may be necessary to use the moments for a ramp or quadratic input excitation in Equation (11), to obtain stable poles, a step-response approximation can be computed by substituting the values of these poles and the step-response moments into Equation (11) to solve for the corresponding residues.

9.B.2. Forming a Common Denominator for the Response Approximation at any Node, 80

It would appear from the discussion in section 9.B.1., that as different nodes in the interconnect circuit are selected for evaluation by the system user, the entire procedure for calculating a stable dominant pole approximation must be repeated, since the residues corresponding to each of the circuit's characteristic poles differ at each node. However, according to another aspect of the present invention, the repeated steps of dominant pole approximation for each node can be eliminated in favor of a single approximation that is usable with all nodes. This aspect of the present invention is referred to as the common denominator technique.

The common denominator technique is based on the assumption that a dominant pole approximation need only be generated for the input node or driving point in order to accurately characterize the transient response of the remaining nodes given each node's respective residues. Stated alternatively, the denominator of the transfer function corresponding to the driving point can be used with all other nodes. For example, it will be understood by one skilled in the art that any pole whose influence is not significantly felt at the driving node—so as to be included into an additional order of approximation—will not significantly influence the response at any other node and can be ignored for all practical purposes.

It will still be necessary to calculate the set of residues corresponding to each order of approximation at each desired response node. However, these residues can be efficiently calculated using the steps described in section 9.B.1.

Figure 16:
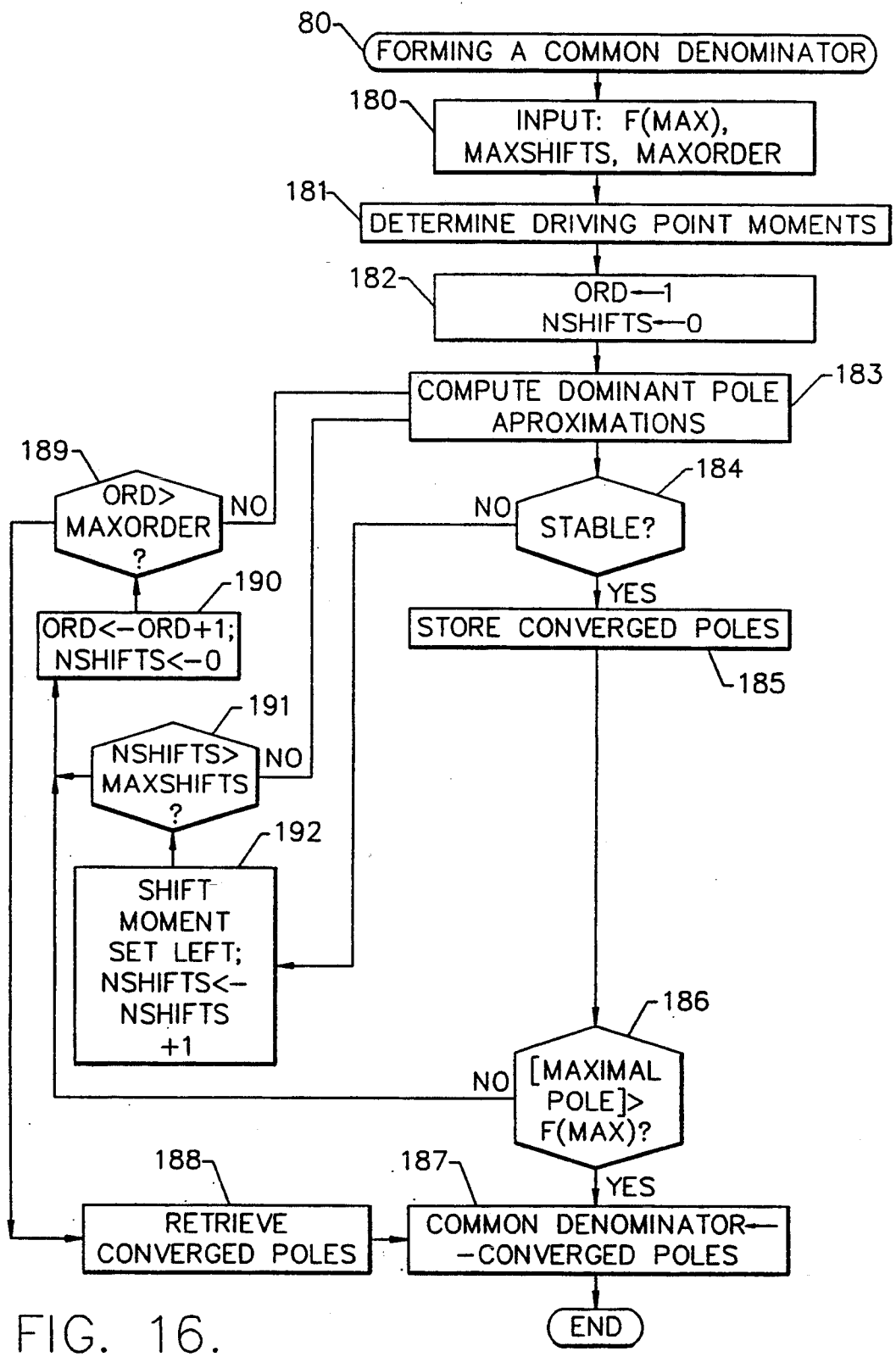
FIG. 16 illustrates operations for computing the moments of the driving point to form a common denominator and including moment shifting to guarantee stability.

Referring now to FIG. 16, the procedures for forming a common denominator and generating the dominant poles of an interconnect circuit using the moment shifting technique described in 9.B.1, will be described. First, the system user specifies (1) the maximum frequency component of the excitation signal F(max), (2) the maximum allowable shifts in the moment series that will be permitted MAXSHIFT, and (3) the maximum order of approximation desired, MAXORDER, as shown by Block 180. Next, the step response moments for the driving point, previously calculated, are retrieved, Block 181.

In Block 182, the initial order of the approximation ORD is set to one (1) and the number of moment shifts is set to zero (0) to begin the procedure. In Block 183, the first ORD dominant poles are calculated; if all are negative, i.e., the approximation is stable, the poles are stored, Block 185, and a inquiry is made to see if the highest order pole is outside the preselected frequency range F(max), Block 186. If the inquiry is negative, additional poles will be required for the approximate model and the value ORD is incremented by one (1) to reflect the additional order, Block 190. Otherwise, the poles are put into common denominator form and the procedure is complete, Block 187.

Referring again to Block 184, if the first ORD dominant poles are not all stable, the moment series corresponding to the driving point is shifted, Block 192. If the number of total shifts performed on the driving point moment series is less than the user selected value MAXSHIFTS, the first ORD dominant poles are calculated again and the procedure is repeated, Blocks 191, 183. Otherwise, the order of approximation ORD is incremented and NSHIFT is set to zero, Block 190. If ORD does not exceed MAXORDER, the driving point moment series is used to compute the next higher order of approximation in Block 183. If the MAXORDER value is exceeded, the poles are retrieved and put in common denominator form, Blocks 188, 187.

Alternatively, for high-speed transmission-line interconnects, where the maximum frequency is very high, and as many complex poles as available are necessary, the following technique may be used. Rather than start at a 2nd-order approximation (which is known to be insufficient), processing could start at MAXORDER and attempt to obtain a stable approximation using moment shifting. If not possible, the order is reduced by one and the process is repeated. In other words, processing proceeds backwards. This is preferred for transmission-line (RLC interconnects) problems, where it is indeed possible to have a large number of dominant poles. It is not preferred for RC interconnects, where starting from order=1 is preferred, since the number of dominant poles is generally small.

10. Produce Simulation, 90

Figure 17:
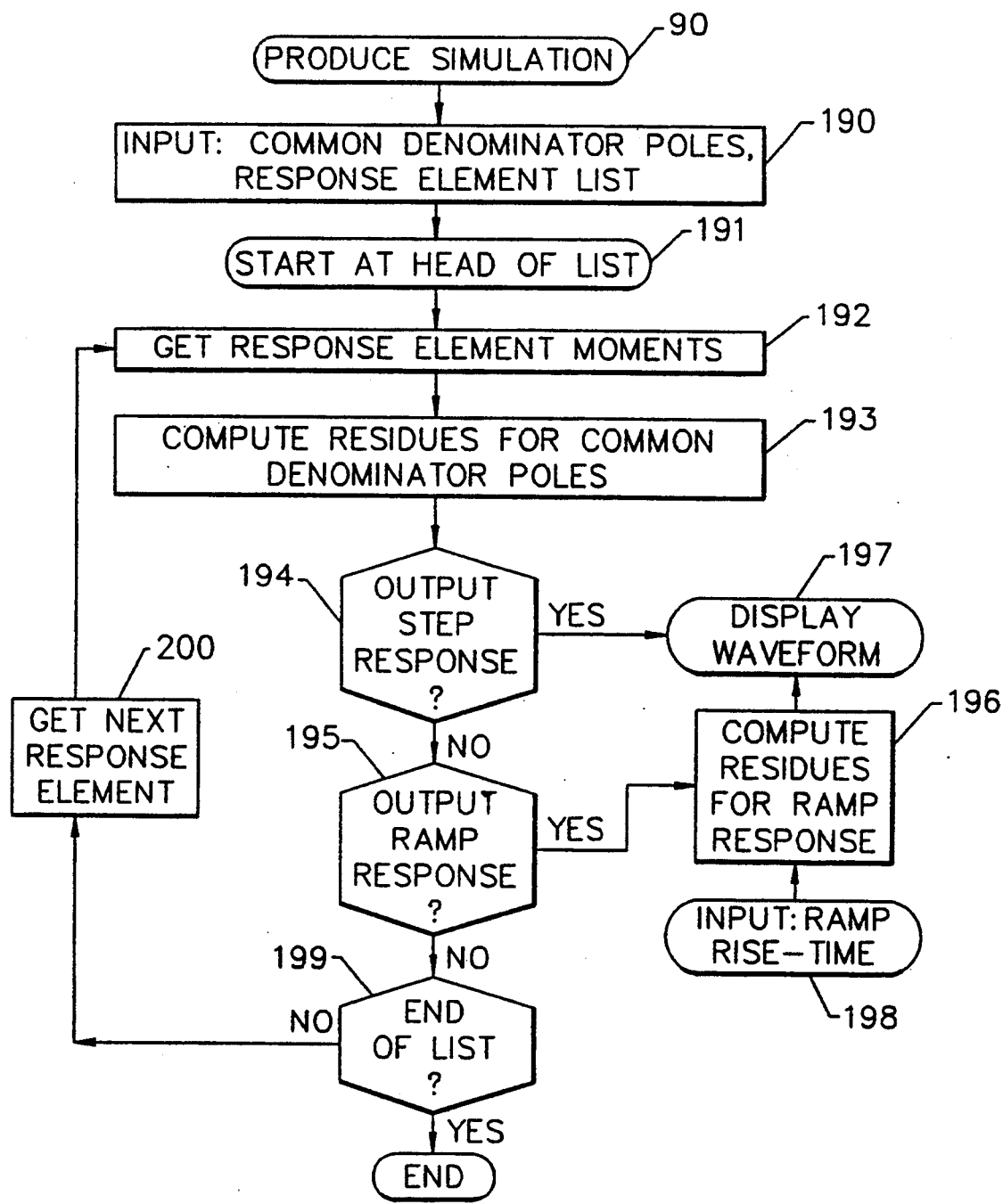
FIG. 17 illustrates operations for producing a simulation of the modelled interconnect circuit.

Referring now to FIG. 17, the first step in producing the simulation requires the retrieval of the common denominator poles and the list of response nodes previously selected by the system user, Block 190. Then, starting with the first selected node, the residues for each pole are calculated using the selected node's moments as described in section 9.B.1, Blocks 192 and 193. If the desired simulation corresponds to a step function excitation, the time domain response is displayed, Blocks 194, 197. If the response to a ramp excitation is desired, the system user selects a desired rise time and a new set of residues is then calculated for the ramp, and the response displayed, Blocks 196, 198. The process is repeated for each desired node response, Blocks 199, o 200, and completed when the waveforms for the full set of desired nodes have been displayed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for simulating behavior of a microelectronic circuit, comprising the steps of:
   storing a representation of said microelectronic circuit in a computer;
   transforming the stored representation of said microelectronic circuit into an equivalent DC circuit containing resistive and capacitive elements;
   converting said equivalent DC circuit for said microelectronic circuit into a directed graph having a spanning tree;
   traversing said spanning tree of said directed graph to obtain unshifted moments of said microelectronic circuit including resistive and capacitive elements;
   shifting said unshifted moments to obtain shifted moments;
   determining poles of said microelectronic circuit from said shifted moments;
   determining residues from said unshifted moments and the poles; and
   producing a time domain simulation of the behavior of said microelectronic circuit from the poles and residues.

2. The method of claim 1 wherein said microelectronic circuit comprises a microelectronic interconnect circuit.

3. The method of claim 1 wherein said producing step is followed by the steps of:
   modifying said microelectronic circuit in response to the time domain simulation of the behavior of said microelectronic circuit; and
   manufacturing the modified microelectronic circuit.

4. The method of claim 1 wherein said traversing step comprises the steps of:
   traversing said spanning tree;
   storing a representation of the traversal of said spanning tree; and
   obtaining said moments of said microelectronic circuit from the stored representation of said traversal of said spanning tree.

5. The method of claim 4 wherein said traversing step comprises the step of traversing said spanning tree only once.

6. The method of claim 4 wherein said traversal representation storing step comprises the step of storing instructions for generating tree branch currents for each node of the spanning tree which is traversed.

7. The method of claim 6 wherein said traversal representation storing step further comprises the step of storing instructions for generating node voltages for each node of the spanning tree which is traversed.

8. The method of claim 4 wherein said traversing and traversal representation storing steps comprise the steps of:
   reverse traversing said spanning tree;
   storing a first representation of the reverse traversal;
   forward traversing said spanning tree; and
   storing a second representation of the forward traversal.

9. The method of claim 4 wherein said traversal representation storing step comprises the step of storing a virtual path trace of said spanning tree; and wherein said obtaining moments step comprises the step of obtaining said moments of said microelectronic circuit by traversing said virtual path trace of said spanning tree.

10. The method of claim 9 wherein said microelectronic circuit includes a resistor loop; and wherein said obtaining step is preceded by the steps of:
    traversing said spanning tree with said resistor loop removed; and
    determining the resistor loop current from the traversal of said spanning tree with said resistor loop removed.

11. The method of claim 1 wherein said traversing step comprises the steps of;
    traversing said spanning tree;
    obtaining a generation of moments from the traversal of said spanning tree; and
    repeatedly performing said traversing and obtaining steps to obtain multiple generations of moments.

12. The method of claim 11 wherein said repeatedly performing step comprises the step of obtaining each of said multiple generations of moments based upon previously obtained generations of moments.

13. The method of claim 1 wherein said traversing step is followed by the steps of:
    determining at least one pole of said microelectronic circuit from said unshifted moments of said microelectronic circuit; and
    determining whether the at least one pole is stable; and
    wherein said moment shifting step comprises the step of shifting said unshifted moments if said at least one pole is unstable;
    wherein said pole determining step comprises the step of determining at least one stable pole of said microelectronic circuit from said shifted moments;
    wherein said residue determining step comprises the step of determining residues from said unshifted moments and the at least one stable pole; and
    wherein said time domain simulation producing step comprises the step of producing a time domain simulation of the behavior of said microelectronic circuit from the at least one stable pole and the residues.

14. The method of claim 1
    wherein said traversing step comprises the step of producing an unshifted plurality of generations of moments for said microelectronic circuit, ranging from a low order moment generation to a high order moment generation, and is followed by the steps of:
    determining at least one pole of said microelectronic circuit from said unshifted plurality of generations of moments of said microelectronic circuit; and
    determining whether the at least one pole is stable; and
    wherein said moment shifting step comprises the step of shifting said unshifted plurality of generations of moments to include at least one next higher moment generation and eliminate at least one low order moment generation if said at least one pole is unstable and thereby produce a shifted plurality of generations of moments;

wherein said pole determining step comprises the step of determining at least one stable pole from said shifted plurality of generations of moments;

wherein said residue determining step comprises the step of determining residues from said unshifted plurality of generations of moments and the at least one stable pole; and wherein said time domain simulation producing step comprises the step of producing a time domain simulation of the behavior of said microelectronic circuit from the at least one stable pole and the residues.

15. The method of claim 1 wherein said traversing step comprises the step of traversing said spanning tree of said directed graph to obtain an unshifted plurality of generations of moments for said microelectronic circuit, ranging from a low order moment generation to a high order moment generation, and is followed by the steps of:

determining poles of said microelectronic circuit from said unshifted plurality of generations of moments;

determining whether the poles are stable; and wherein said moment shifting step comprises the step of shifting the unshifted plurality of generations of moments to include at least one next higher moment generation and eliminate at least one low order moment generation if any of said poles are unstable and thereby produce a shifted plurality of generation of moments;

wherein said pole determining step comprises the step of determining stable poles from said shifted plurality of generations of moments;

wherein said residue determining step comprises the step of determining residues from said unshifted plurality of generations of moments and the stable poles; and wherein said time domain simulation producing step comprises the step of producing a time domain simulation of the behavior of said microelectronic circuit from the stable poles and the residues.

16. The method of claim 1 wherein said microelectronic circuit includes a driving point;

wherein said traversing step comprises the step of traversing said spanning tree to obtain unshifted driving point moments corresponding to said driving point, and is followed by the steps of:

determining first driving point poles based on the unshifted driving point moments; and determining the stability of the first driving point poles by:

shifting said unshifted driving point moments to obtain first shifted driving point moments;

determining second driving point poles based on said first shifted driving point moments; and determining convergence of the first driving point poles with the second driving point poles; and wherein said moment shifting step comprises the step of shifting said first shifted driving point moments to obtain second shifted driving point moments if the first driving point poles are unstable;

wherein said pole determining step comprises the step of determining third driving point poles based on the second shifted driving point moments;

wherein said residue determining step comprises the step of determining residues from said unshifted driving point moments and the second driving point poles; and wherein said producing step comprises the step of producing a time domain simulation of the behavior of said microelectronic circuit from the second driving point poles and the residues.

17. The method of claim 16 wherein said producing step is preceded by the step of determining residues of said microelectronic circuit from said unshifted driving point moments of said microelectronic circuit and the second driving point poles; and wherein said residue determining step is preceded by the step of determining the stability of the second driving point poles based on convergence with the third driving point poles.

18. The method of claim 1 wherein said traversing step comprises the following steps:

traversing said spanning tree of said directed graph;

vectorizing the traversal of said spanning tree so as to traverse said spanning tree only once; and obtaining said moments of said microelectronic circuit from the vectorized traversal of said spanning tree.

19. The method of claim 1 wherein said microelectronic circuit includes a resistor loop; and wherein said traversing step comprises the steps of:

traversing said spanning tree with said resistor loop removed;

determining the resistor loop current from the traversal of said spanning tree with said resistor loop removed; and traversing said spanning tree including said resistor loop current to obtain moments of said microelectronic circuit.

20. The method of claim 1 wherein said microelectronic circuit is of tree or near-tree topology;

wherein said converting step comprises the step of converting said equivalent DC circuit into an ordered nodal analysis matrix; and wherein said traversing step comprises the step of factorizing the ordered nodal analysis matrix to obtain moments of said microelectronic circuit.

21. A method for simulating behavior of a microelectronic circuit, comprising the steps of:

storing a representation of said microelectronic circuit in a computer;

transforming the stored representation of said microelectronic circuit into an equivalent DC circuit containing resistive and capacitive elements;

converting said equivalent DC circuit for said microelectronic circuit into a directed graph having a spanning tree;

traversing said spanning tree of said directed graph to obtain moments of said microelectronic circuit including resistive and capacitive elements;

mapping said moments of said microelectronic circuit into poles and residues for said microelectronic circuit;

simultaneously with said mapping step, constraining said mapping to produce stable poles for said microelectronic circuit; and producing a time domain simulation of the behavior of said microelectronic circuit from the stable poles and residues.

22. The method of claim 21 wherein said microelectronic circuit is of tree or near-tree topology;

wherein said converting step comprises the step of converting said equivalent DC circuit into an ordered nodal analysis matrix; and wherein said traversing step comprises the step of factorizing the ordered nodal analysis matrix to obtain moments of said microelectronic circuit.

23. The method of claim 2s wherein said constraining step comprises the step of constraining said mapping using a transformation function to produce stable poles for said microelectronic circuit.

24. The method of claim 21 wherein said microelectronic circuit comprises a microelectronic interconnect circuit.

25. The method of claim 21 wherein said producing step is followed by the steps of:

modifying said microelectronic circuit in response to the time domain simulation of the behavior of said microelectronic circuit; and manufacturing the modified microelectronic circuit.

26. The method of claim 21 wherein said traversing step comprises the steps of:

traversing said spanning tree;

storing a representation of the traversal of said spanning tree; and obtaining said moments of said microelectronic circuit from the stored representation of said traversal of said spanning tree.

27. The method of claim 26 wherein said traversing step comprises the step of traversing said spanning tree only once.

28. The method of claim 26 wherein said traversal representation storing step comprises the step of storing instructions for generating tree branch currents for each node of the spanning tree which is traversed.

29. The method of claim 28 wherein said traversal representation storing step further comprises the step of storing instructions for generating node voltages for each node of the spanning tree which is traversed.

30. The method of claim 26 wherein said traversing and traversal representation storing steps comprise the steps of:

reverse traversing said spanning tree;

storing a first representation of the reverse traversal;

forward traversing said spanning tree; and storing a second representation of the forward traversal.

31. The method of claim 26 wherein said traversal representation storing step comprises the step of storing a virtual path trace of said spanning tree; and wherein said obtaining moments step comprises the step of obtaining said moments of said microelectronic circuit by traversing said virtual path trace of said spanning tree.

32. The method of claim 31 wherein said microelectronic circuit includes a resistor loop; and wherein said obtaining step is preceded by the steps of:

traversing said spanning tree with said resistor loop removed; and determining the resistor loop current from the traversal of said spanning tree with said resistor loop removed.

33. The method of claim 21 wherein said traversing step comprises the steps of;

traversing said spanning tree;

obtaining a generation of moments from the traversal of said spanning tree; and repeatedly performing said traversing and obtaining steps to obtain multiple generations of moments.

34. The method of claim 33 wherein said repeatedly performing step comprises the step of obtaining each of said multiple generations of moments based upon previously obtained generations of moments.

35. The method of claim 21 wherein said microelectronic circuit includes a resistor loop; and wherein said traversing step comprises the steps of:

traversing said spanning tree with said resistor loop removed;

determining the resistor loop current from the traversal of said spanning tree with said resistor loop removed; and traversing said spanning tree including said resistor loop current to obtain moments of said microelectronic circuit.

36. The method of claim 21 wherein said traversing step comprises the following steps:

traversing said spanning tree of said directed graph;

vectorizing the traversal of said spanning tree so as to traverse said spanning tree only once; and obtaining said moments of said microelectronic circuit from the vectorized traversal of said spanning tree.

37. A computer apparatus for simulating behavior of a microelectronic circuit, comprising:

means for storing a representation of said microelectronic circuit in a computer;

means, responsive to said storing means, for transforming the stored representation of said microelectronic circuit into an equivalent DC circuit containing resistive and capacitive elements;

means, responsive to said transforming means, for converting said equivalent DC circuit for said microelectronic circuit into a directed graph having a spanning tree;

means, responsive to said converting means, for traversing said spanning tree of said directed graph to obtain unshifted moments of said microelectronic circuit including resistive and capacitive elements;

means, responsive to said traversing means, for shifting said unshifted moments to obtain shifted moments;

means, responsive to said shifting means, for determining poles of said microelectronic circuit from said shifted moments;

means, responsive to said traversing means and said pole determining means, for determining residues from said unshifted moments and the poles; and means, responsive to said pole determining means and said residue determining means, for producing a time domain simulation of the behavior of said microelectronic circuit from the poles and residues.

38. The computer apparatus of claim 37 wherein said microelectronic circuit is of tree or near-tree topology;

wherein said converting means comprises means for converting said equivalent DC circuit into an ordered nodal analysis matrix; and wherein said traversing means comprises means for factorizing the ordered nodal analysis matrix to obtain moments of said microelectronic circuit.

39. The computer apparatus of claim 38 wherein said microelectronic circuit comprises a microelectronic interconnect circuit.

40. The computer apparatus of claim 37 further comprising:

means, responsive to said producing means, for modifying said microelectronic circuit in response to the time domain simulation of the behavior of said microelectronic circuit; and means, responsive to said modifying means, for manufacturing the modified microelectronic circuit.

41. The computer apparatus of claim 37 wherein said traversing means comprises:
   means for traversing said spanning tree;
   means, responsive to said traversing means, for storing a representation of the traversal of said spanning tree; and
   means, responsive to said representation storing means, for obtaining said moments of said microelectronic circuit from the stored representation of said traversal of said-spanning tree.

42. The computer apparatus of claim 41 wherein said traversing means comprises means for traversing said spanning tree only once.

43. The computer apparatus of claim 41 wherein said traversal representation storing means comprises the means for storing instructions for generating tree branch currents for each node of the spanning tree which is traversed.

44. The computer apparatus of claim 43 wherein said traversal representation storing means further comprises means for storing instructions for generating node voltages for each node of the spanning tree which is traversed.

45. The computer apparatus of claim 41 wherein said traversing means comprises:
   means for reverse traversing said spanning tree; and
   means for forward traversing said spanning tree.

46. The computer apparatus of claim 41 wherein said traversal representation storing means comprises means for storing a virtual path trace of said spanning tree; and wherein said obtaining moments means comprises means for obtaining said moments of said microelectronic circuit by traversing said virtual path trace of said spanning tree.

47. The computer apparatus of claim 46 wherein said microelectronic circuit includes a resistor loop; and wherein said obtaining means comprises:
   means for traversing said spanning tree with said resistor loop removed; and
   means, responsive to said traversing means, for determining the resistor loop current from the traversal of said spanning tree with said resistor loop removed.

48. The computer apparatus of claim 38 further comprising:
   first means, responsive to said traversing means, for determining at least one pole of said microelectronic circuit from said unshifted moments of said microelectronic circuit;
   second means, responsive to said first means, for determining whether said at least one pole is stable; and
   wherein said shifting means comprises means for shifting said unshifted moments if said at least one pole is unstable, thereby obtaining shifted moments.

49. The computer apparatus of claim 38 wherein said traversing means comprises means for obtaining an unshifted plurality of generations of moments for said microelectronic circuit, ranging from a low order moment generation to a high order moment generation, said apparatus further comprising:
   first means, responsive to said obtaining means, for determining at least one pole of said microelectronic circuit from said unshifted plurality of generations of moments of said microelectronic circuit; and
   second means, responsive to said first means, for determining whether said at least one pole is stable; and
   wherein said shifting means comprises means, responsive to said second means, for shifting said unshifted plurality of generations of moments to include at least one next higher moment generation and eliminate at least one low order moment generation if said at least one pole is unstable, thereby obtaining shifted moments.

50. The computer apparatus of claim 38 wherein said traversing means comprises means for traversing said spanning tree of said directed graph to obtain an unshifted plurality of generations of moments for said microelectronic circuit, ranging from a lowest order moment generation to a highest order moment generation, said apparatus further comprising:
   first means, responsive to said obtaining means, for determining at least one pole of said microelectronic circuit from said unshifted plurality of generations of moments of said microelectronic circuit; and
   second means, responsive to said first means, for determining whether said at least one pole is stable; and
   wherein said shifting means comprises means, responsive to said second means, for shifting said unshifted plurality of generations of moments to include at least one next higher moment generation and eliminate at least one low order moment generation if any of said poles are unstable, thereby obtaining shifted moments.

51. The computer apparatus of claim 38 wherein said microelectronic circuit includes a driving point;
   wherein said traversing means comprises means for traversing said spanning tree of said directed graph to obtain unshifted moments corresponding to the driving point;
   wherein said shifting means comprises means for shifting said unshifted driving point moments to obtain shifted driving point moments;
   wherein said pole determining means comprises means for determining driving point poles from said shifted driving point moments;
   wherein said residue determining means comprises means for determining residues from said unshifted driving point moments and the driving point poles; and
   wherein said producing means comprises means for producing a time domain simulation of the behavior of said microelectronic circuit from the driving point poles and the residues.

52. The computer apparatus of claim 51 further comprising:
   means for determining whether the driving point poles are stable; and
   wherein said residue determining means comprises means for determining residues of said microelectronic circuit from said unshifted driving point moments of said microelectronic circuit and the driving point poles.

53. The computer apparatus of claim 37 wherein said traversing means comprises:
   means for traversing-said spanning tree of said directed graph;

means, responsive to said traversing means, for vectorizing the traversal of said spanning tree so as to traverse said spanning tree only once; and means, responsive to said vectorizing means, for obtaining said moments of said microelectronic circuit from the vectorized traversal of said spanning tree.

54. The computer apparatus of claim 37 wherein said microelectronic circuit includes a resistor loop; and wherein said traversing means comprises:

means for traversing said spanning tree with said resistor loop removed;

means, responsive to said traversing means, for determining the resistor loop current from the traversal of said spanning tree with said resistor loop removed; and means, responsive to said determining means, for traversing said spanning tree including said resistor loop current to obtain moments of said microelectronic circuit.

55. A computer apparatus simulating behavior of a microelectronic circuit, comprising:

means for storing a representation of said microelectronic circuit in a computer;

means, responsive to said storing means, for transforming the stored representation of said microelectronic circuit into an equivalent DC circuit containing resistive and capacitive elements;

means, responsive to said transforming means, for converting said equivalent DC circuit for said microelectronic circuit into a directed graph having a spanning tree;

means, responsive to said converting means, for traversing said spanning tree of said directed graph to obtain moments of said microelectronic circuit including resistive and capacitive elements;

means, responsive to said traversing means, for mapping said moments of said microelectronic circuit into poles and residues for said microelectronic circuit;

means, responsive to said mapping means, for simultaneously constraining said mapping to produce stable poles for said microelectronic circuit; and means, responsive to said mapping means and said constraining means, for producing a time domain simulation of the behavior of said microelectronic circuit from the stable poles and residues.

56. The computer apparatus of claim 55 wherein said microelectronic circuit includes a resistor loop; and wherein said traversing means comprises:

means for traversing said spanning tree with said resistor loop removed;

means, responsive to said traversing means, for determining the resistor loop current from the traversal of said spanning tree with said resistor loop removed; and means, responsive to said determining means, for traversing said spanning tree including said resistor loop current to obtain moments of said microelectronic circuit.

57. The computer apparatus of claim 55 wherein said microelectronic circuit is of tree or near-tree topology;

wherein said converting means comprises means for converting said equivalent DC circuit into an ordered nodal analysis matrix; and wherein said traversing means comprises means for factorizing the ordered nodal analysis matrix to obtain moments of said microelectronic circuit.

58. The computer apparatus of claim 55 wherein said constraining means comprises means for simultaneously constraining said mapping using a transformation function to produce stable poles for said microelectronic circuit.

59. The computer apparatus of claim 55 wherein said microelectronic circuit comprises a microelectronic interconnect circuit.

60. The computer apparatus of claim 55 further comprising:

means, responsive to said producing means, for modifying said microelectronic circuit in response to the time domain simulation of the behavior of said microelectronic circuit; and means, responsive to said modifying means, for manufacturing the modified microelectronic circuit.

* * * * *

UNITED STATES PATENT AND TRADEMARK OFFICE
CERTIFICATE OF CORRECTION

PATENT NO. : 5,379,231
DATED : January 3, 1995
INVENTOR(S) : Pillage et al.

It is certified that error appears in the above-indentified patent and that said Letters Patent is hereby corrected as shown below:

ON THE COVER PAGE, Item [54] title of the invention and;

Col. 1, in the title, "MICROELECTRIC" should be -- MICROELECTRONIC --.

Col. 1, under References Cited, "Lardman" should be -- Landman --.

Col. 1, under Other Publications, first publication, line 2, "Approximation" should be -- Approximations --.

Col. 2, under Other Publications, line 1, "John W. Lee" should be -- John Y. Lee --.

Col. 1, line 32, "computer" should be -- Computer --.

Col. 5, line 42, begin a new paragraph with -- FIG. 17 illustrates operations for producing a simulation of the modelled interconnect circuit --.

Col. 8, line 7, "Rohrer and Pillage" should be -- Pillage and Rohrer --.

UNITED STATES PATENT AND TRADEMARK OFFICE
CERTIFICATE OF CORRECTION

PATENT NO. : 5,379,231
DATED : January 3, 1995
INVENTOR(S) : Pillage et al.

Page 2 of 4

It is certified that error appears in the above-indentified patent and that said Letters Patent is hereby corrected as shown below:

Col. 10, line 20, in the heading, after "7A" the comma should be a period.

Col. 11, line 4, insert a new line -- case --.

Col. 20, line 17, "virtual" should be -- Virtual --.

Col. 20, line 62, in the heading, "$V_{is}$" should be -- $V_{in}$ --.

Col. 21, line 59, "122" should be -- 121 --.

Col. 24, line 27, in the heading, "8B.3." should be -- 8.B.3. --.

Col. 25, line 12, in the heading, "compact circuit" should be -- Compact Circuit --.

Col. 28, Equation 8 should read $$h_q(t) = k_1 e^{p_1 t} + k_2 e^{p_2 t} + \cdots + k_q e^{p_q t}$$

$$H_q(s) = \frac{k_1}{s-p_1} + \frac{k_2}{s-p_2} + \cdots + \frac{k_q}{s-p_q} \tag{8}$$

UNITED STATES PATENT AND TRADEMARK OFFICE
CERTIFICATE OF CORRECTION

PATENT NO. : 5,379,231

DATED : January 3, 1995

INVENTOR(S) : Pillage et al.

It is certified that error appears in the above-indentified patent and that said Letters Patent is hereby corrected as shown below:

Col. 29, Equation 9, after the equal sign, move the last section of the equation from lines 13-21 to lines 4-12.

Col. 29, line 66, "s⁰, S¹, S²" should be -- $s^0, s^1, s^2$ --.

Col. 30, line 5, after "$m_2$" insert a comma and a space.

Col. 30, line 22, after "..." insert a comma.

Col. 30, Equation 15, "l" should be -- 1 -- (all three).

Col. 30, Equation 15, ".." should be -- ... --.

Col. 30, Equation 17, should read as follows:

$$\hat{k}_r = \frac{k_r}{p_r^j}, \quad r = 1, 2, \cdots, n \qquad (17)$$

Col. 32, line 6, "9.B.1," should be -- 9.B.1. --.

Col. 33, line 4, at the end of the line, omit "o".

UNITED STATES PATENT AND TRADEMARK OFFICE
CERTIFICATE OF CORRECTION

PATENT NO. : 5,379,231
DATED : January 3, 1995
INVENTOR(S) : Pillage et al.

It is certified that error appears in the above-indentified patent and that said Letters Patent is hereby corrected as shown below:

Col. 37, line 7, "2s" should be -- 21 --.

Col. 38, line 62, "38" should be -- 37 --.

Col. 39, line 48, "38" should be -- 37 --.

Col. 39, line 61, "38" should be -- 37 --.

Col. 40, line 14, "38" should be -- 37 --.

Col. 40, line 36, "38" should be -- 37 --.

Signed and Sealed this

Twenty-second Day of October, 1996

Attest:

BRUCE LEHMAN

*Attesting Officer*　　　*Commissioner of Patents and Trademarks*

UNITED STATES PATENT AND TRADEMARK OFFICE
CERTIFICATE OF CORRECTION

PATENT NO. : 5,379,231
APPLICATION NO. : 07/891649
DATED : January 3, 1995
INVENTOR(S) : Pillage et al.

It is certified that error appears in the above-identified patent and that said Letters Patent is hereby corrected as shown below:

At page 1 below the title, please add the following paragraph:

Government Support
This invention was made with government support under 9007917 awarded by the National Science Foundation. The government has certain rights in the invention.

Signed and Sealed this

Twenty-seventh Day of April, 2010

David J. Kappos
*Director of the United States Patent and Trademark Office*